US010037966B2

(12) United States Patent
Iwasaki et al.

(10) Patent No.: US 10,037,966 B2
(45) Date of Patent: Jul. 31, 2018

(54) SEMICONDUCTOR DEVICE AND MANUFACTURING METHOD THEREFOR

(71) Applicant: Renesas Electronics Corporation, Koutou-ku, Tokyo (JP)

(72) Inventors: Toshihiro Iwasaki, Kanagawa (JP); Takeumi Kato, Kanagawa (JP); Takanori Okita, Kanagawa (JP); Yoshikazu Shimote, Kanagawa (JP); Shinji Baba, Kanagawa (JP); Kazuyuki Nakagawa, Kanagawa (JP); Michitaka Kimura, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/375,072

(22) Filed: Dec. 9, 2016

(65) Prior Publication Data

US 2017/0092614 A1 Mar. 30, 2017

Related U.S. Application Data

(62) Division of application No. 13/274,296, filed on Oct. 14, 2011, now abandoned.

(30) Foreign Application Priority Data

Oct. 21, 2010 (JP) ................. 2010-236213

(51) Int. Cl.
*H01L 23/00* (2006.01)
*H01L 25/04* (2014.01)
(Continued)

(52) U.S. Cl.
CPC .......... *H01L 24/81* (2013.01); *H01L 21/4853* (2013.01); *H01L 21/563* (2013.01);
(Continued)

(58) Field of Classification Search
CPC ......... H01L 24/03; H01L 24/10; H01L 24/11; H01L 24/81; H01L 25/043;
(Continued)

(56) References Cited

U.S. PATENT DOCUMENTS 5,284,796 A 2/1994 Nakanishi et al.
5,668,058 A 9/1997 Tanioka et al.
(Continued)

FOREIGN PATENT DOCUMENTS

JP S54-83374 A 7/1979
JP H07-58153 A 3/1995
(Continued)

OTHER PUBLICATIONS

Office Action dated Apr. 22, 2014, in Japanese Patent Application No. 2010-236213.

*Primary Examiner* — David Zarneke
(74) *Attorney, Agent, or Firm* — Shapiro, Gabor and Rosenberger, PLLC

(57) ABSTRACT

The joint reliability in flip chip bonding of a semiconductor device is enhanced. Prior to flip chip bonding, flux 9 is applied to the solder bumps 5a for flip chip bonding over a substrate and reflow/cleaning is carried out and then flip chip bonding is carried out. This makes is possible to thin the oxide film over the surfaces of the solder bumps 5a and make the oxide film uniform. As a result, it is possible to suppress the production of local solder protrusions to reduce the production of solder bridges during flip chip bonding and enhance the joint reliability in the flip chip bonding of the semiconductor device.

6 Claims, 24 Drawing Sheets

(51) Int. Cl.
*H01L 25/065* (2006.01)
*H01L 25/07* (2006.01)
*H01L 25/11* (2006.01)
*H01L 21/48* (2006.01)
*H01L 21/56* (2006.01)
*H01L 25/075* (2006.01)

(52) U.S. Cl.
CPC ............ *H01L 24/03* (2013.01); *H01L 24/04* (2013.01); *H01L 24/11* (2013.01); *H01L 24/94* (2013.01); *H01L 25/043* (2013.01); *H01L 25/0657* (2013.01); *H01L 25/074* (2013.01); *H01L 25/0756* (2013.01); *H01L 25/117* (2013.01); *H01L 2224/03622* (2013.01); *H01L 2224/0401* (2013.01); *H01L 2224/1132* (2013.01); *H01L 2224/1147* (2013.01); *H01L 2224/1181* (2013.01); *H01L 2224/11849* (2013.01); *H01L 2224/8101* (2013.01); *H01L 2224/81024* (2013.01); *H01L 2224/81048* (2013.01); *H01L 2224/81193* (2013.01); *H01L 2924/3841* (2013.01)

(58) Field of Classification Search
CPC ............ H01L 25/0657; H01L 25/074; H01L 25/0756; H01L 25/117
See application file for complete search history.

(56) References Cited

U.S. PATENT DOCUMENTS

| | | | |
|---|---|---|---|
| 6,121,062 | A | 9/2000 | Karasawa et al. |
| 6,399,119 | B1 | 6/2002 | Vandamme et al. |
| 6,722,557 | B2 | 4/2004 | Tanaka |
| 6,798,072 | B2 | 9/2004 | Kajiwara et al. |
| 6,838,316 | B2 | 1/2005 | Iizuka et al. |
| 7,470,996 | B2 | 12/2008 | Yoneyama et al. |
| 7,575,150 | B2 | 8/2009 | Saito et al. |
| 7,838,335 | B2 | 11/2010 | Hayashi et al. |
| 8,072,059 | B2* | 12/2011 | Shim, II ................ H01L 21/568 257/698 |
| 8,673,684 | B2* | 3/2014 | Ihara ...................... H01G 2/065 257/E21.502 |
| 2006/0255458 | A1* | 11/2006 | Dangelmaier ........ H01L 23/055 257/735 |
| 2008/0292846 | A1* | 11/2008 | Muranaga ............ H01L 23/053 428/157 |
| 2010/0093131 | A1 | 4/2010 | Maeda |
| 2010/0320258 | A1 | 12/2010 | Sawada et al. |
| 2011/0076801 | A1 | 3/2011 | Aoki et al. |
| 2011/0079896 | A1 | 4/2011 | Satoh et al. |
| 2012/0049344 | A1* | 3/2012 | Pagaila ................... H01L 21/56 257/737 |

FOREIGN PATENT DOCUMENTS

| | | |
|---|---|---|
| JP | 2001-332575 | 11/2001 |
| JP | 2007-227555 A | 9/2006 |

* cited by examiner

FIG. 2
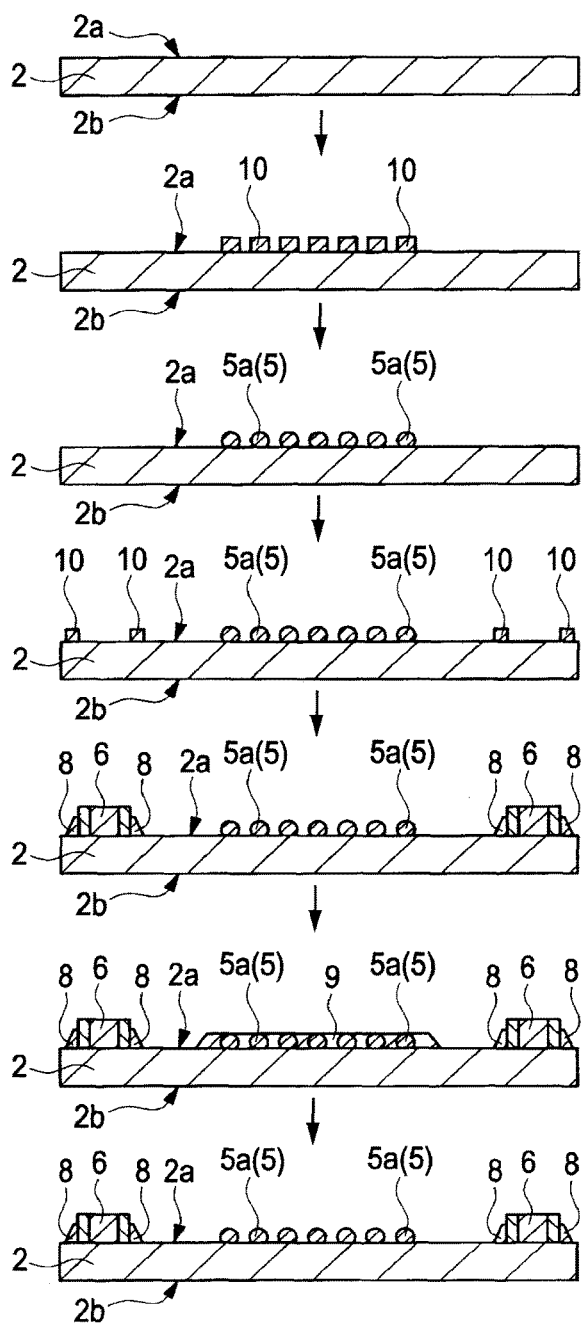
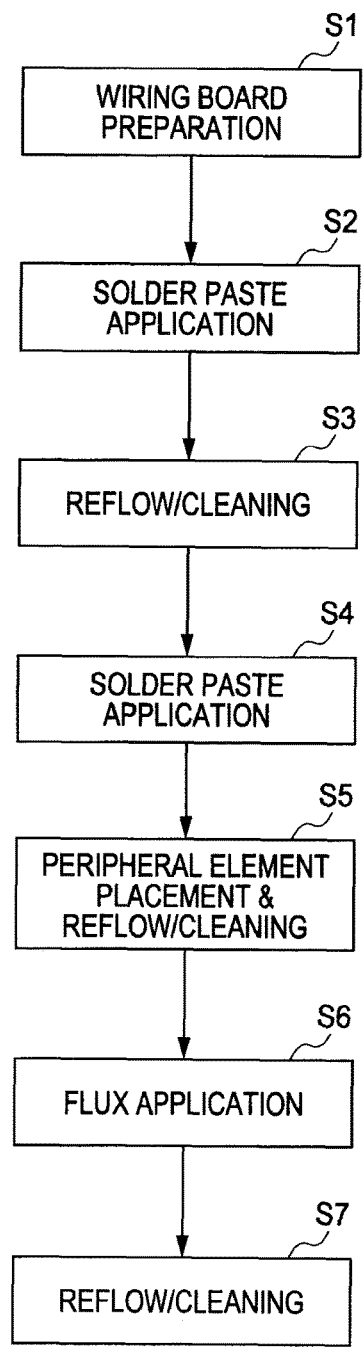
2: WIRING BOARD
2a: UPPER SURFACE
2b: LOWER SURFACE
5a: SOLDER BUMP (BUMP, BUMP ELECTRODE, SOLDER BALL)
6: CHIP COMPONENT (ELECTRONIC COMPONENT)
9: FLUX

SEMICONDUCTOR DEVICE AND MANUFACTURING METHOD THEREFOR

CROSS-REFERENCE TO RELATED APPLICATIONS

The disclosure of Japanese Patent Application No. 2010-236213 filed on Oct. 21, 2010 including the specification, drawings and abstract is incorporated herein by reference in its entirety.

BACKGROUND

The present invention relates to a semiconductor device and processing technologies therefor and in particular to a technology effectively applicable to flip chip bonding using solder bumps.

A technique for taking the following measure in a manufacturing process for semiconductor devices (semiconductor packages) is described in, for example, Japanese Unexamined Patent Publication No. 2007-227555 (Patent Document 1): a semiconductor device with molding resin exposed on the ball surface side is flip chip joined to a wiring board and underfill resin is filled between them.

[Patent Document 1]
Japanese Unexamined Patent Publication No. 2007-227555

SUMMARY

As one of semiconductor devices, flip chip bonded semiconductor devices are known. In the flip chip bonded semiconductor device, the following are electrically coupled together by flip chip bonding: multiple solder bumps formed over a semiconductor chip (hereafter, also simply referred to as chip) and solder bumps formed over the main surface of a substrate in positions corresponding to them. In flip chip bonded semiconductor devices, for example, the following advantages are obtained: the footprint of a semiconductor chip can be reduced as compared with wire bonded semiconductor devices; the number of surface electrodes of a semiconductor chip can be increased; and the signal speed between a semiconductor chip and a substrate can be enhanced.

In conjunction with the enhancement of the functionality of semiconductor devices, the number of pins of each semiconductor device has tended to be increased. As a result, the bump pitch over each semiconductor chip has also tended to be narrowed. Consequently, the gap between bumps is also narrow; therefore, the following can take place when flip chip bonding is carried out using flux: when flux is cleaned off, cleaning fluid cannot get into between a chip and a substrate; and cleaning fluid is less prone to be discharged from between a chip and a substrate and this leads to the production of a residue, and as a result, the flux cannot be completely cleaned off.

Consequently, the present inventors examined fluxless flip chip bonding.

The drawings from FIG. 27 to FIG. 30 illustrate the procedure for fluxless flip chip bonding in a comparative example examined by the present inventors; and the drawings from FIG. 31 to FIG. 33 illustrate how a solder bridge results in solder bump bonding in the comparative example.

As illustrated in FIG. 27, first, a wiring board 2 is positioned and placed in position over the upper surface of a bonding stage 19 heated to a temperature close to a solder melting point. The bonding stage 19 is provided with an exhaust system 19a and is exhausted to vacuum through this exhaust system 19a and is caused to suck and hold the wiring board 2.

Meanwhile, the back surface of a semiconductor chip 4 is sucked and held to the lower surface of a bonding head 18 preheated to a preheat temperature higher than the solder melting point. The bonding head 18 is provided with an exhaust system 18a and is exhausted to vacuum through this exhaust system 18a and is caused to suck and hold the semiconductor chip 4. The semiconductor chip 4 is positioned (aligned) to a predetermined position by the movement of the bonding head 18 in the horizontal direction and in this state, it is positioned above the wiring board 2. Since the bonding head 18 is heated to the predetermined preheat temperature higher than the solder melting point, in this state, the solder bumps 5(5b) formed over the semiconductor chip 4 are melted.

As illustrated in FIG. 28, subsequently, the bonding head 18 is moved down to place the semiconductor chip 4 in position over the wiring board 2. Since the semiconductor chip 4 is sucked to the lower surface of the bonding head 18, it is moved down in the vertical direction as is positioned in the horizontal direction. The semiconductor chip 4 is held over the wiring board 2 for a predetermined time with a predetermined gap maintained between them and is thereby flip chip mounted over the wiring board 2.

Thus the solder bumps 5(5b) formed over the semiconductor chip 4 and the solder bumps 5(5a) formed over the wiring board 2 are brought into contact with each other. The solder bumps 5(5a) on the substrate side are heated from the solder bumps 5(5b) on the chip side and their temperature rises to the solder melting point or higher.

As illustrated in FIG. 29, thereafter, the melted and integrated solder bumps 5 are periodically rhythmically vibrated (scrubbed) either in the horizontal direction X or in the vertical direction Y.

As a result, the oxide film covering the surfaces of the solder bumps 5 is broken and taken into the solder bumps 5 and thus bonding can be carried out without use of flux. As illustrated in FIG. 30, thereafter, the suction of the semiconductor chip 4 to the bonding head 18 is canceled and the bonding head 18 is moved up to terminate the flip chip bonding.

When either of the solder bumps 5 on the chip side and the solder bumps 5 on the substrate side is in a non-melted state and the other is in a melted state in the above-mentioned flip chip bonding, a problem arises. When contacting and pressing are carried out in this state, the following takes place: when the molten solder bumps (solder bumps 5b) are brought into contact with and pressed into the unmelted solder bumps 5a as illustrated in, for example, FIG. 31, the following takes place: the molten solder is concavely deformed by the amount equivalent to this pressing and the unmelted solder is not deformed and becomes convex. As a result, as illustrated in FIG. 32, the melted solder (solder bumps 5b) is so deformed as to cover the unmelted solder (solder bumps 5a) and the temperature of the unmelted solder bumps 5a is rapidly raised and they are melted.

Thereafter, the solder bumps 5a are prevented from being deformed outward by pressing and become local solder protrusions 5c and are protruded in the solder protrusion direction 5d. As a result, a solder bridge becomes prone to be formed between adjacent bumps as illustrated in FIG. 33.

This is because in fluxless flip chip bonding, an oxide film over the surfaces of the solder bumps 5a on the substrate side is nonuniformly formed. When the solder bumps 5b on the chip side are pressed, a solder protrusion 5c may be formed depending on how the above-mentioned oxide film is ripped. That is, the present inventors found that in fluxless flip chip bonding, a solder bridge results (problem).

Patent Document 1 (Japanese Unexamined Patent Publication No. 2007-227555) discloses a fluxless flip chip bonding technique in which the following procedure is taken: the solder balls of a bare chip and the solder balls of a wiring board are brought into contact with each other; they are heated to a temperature higher than the melting point of solder; and ultrasonic vibration is applied to the bare chip to remove the oxide film over the ball surfaces.

The invention has been made with the above problem taken into account and it is an object of the invention to provide a technology that enables the enhancement of joint reliability in flip chip bonding of a semiconductor device.

The above and other objects and novel features of the invention will be apparent from the description in this specification and the accompanying drawings.

The following is a brief description of the gist of the representative elements of the invention laid open in this application:

A semiconductor device according to a representative embodiment includes: a wiring board having an upper surface and a lower surface located on the opposite side to the upper surface and having multiple electrodes for flip chip bonding formed in the upper surface; a semiconductor chip placed over the upper surface of the wiring board by flip chip bonding; and multiple external terminals provided in the lower surface of the wiring board. Between adjacent bumps for the flip chip bonding, the shortest parts where the distance between the following patterns is shortest are placed in positions where they are not opposed to each other between the bumps: the outer shape pattern of each the electrode for flip chip bonding as viewed in a plane and the bump placement portion pattern for the electrode for flip chip bonding as viewed in a plane.

A manufacturing method for a semiconductor device according to a representative embodiment includes the steps of: (a) preparing a wiring board having an upper surface and a lower surface located on the opposite side to the upper surface and having multiple electrodes for flip chip bonding formed in the upper surface; (b) preparing a semiconductor chip with each of multiple bump electrodes formed over an electrode pad; (c) forming a solder ball over each of the electrodes for flip chip bonding of the wiring board; (d) after the step (c), applying flux to the multiple solder balls and then subjecting the solder balls to reflow/cleaning; and (e) flip chip bonding the bump electrodes of the semiconductor chip and the solder balls of the wiring board to each other.

Another manufacturing method for a semiconductor device according to a representative embodiment includes the steps of: (a) preparing a wiring board having an upper surface and a lower surface located on the opposite side to the upper surface and having multiple electrodes for flip chip bonding formed in the upper surface; (b) preparing a semiconductor chip with each of multiple bump electrodes formed over an electrode pad; (c) applying flux paste to each of the electrodes for flip chip bonding of the wiring board; (d) placing a solder ball on the flux paste over each of the electrodes for flip chip bonding; (e) after the step (d), subjecting the multiple solder balls to reflow/cleaning; and (f) flip chip bonding the bump electrodes of the semiconductor chip and the solder balls of the wiring board to each other.

Further another manufacturing method for a semiconductor device according to a representative embodiment includes the steps of (a) preparing a wiring board having an upper surface and a lower surface located on the opposite side to the upper surface and having solder balls formed over multiple electrodes for flip chip bonding in the upper surface; (b) preparing a semiconductor chip with each of multiple bump electrodes formed over an electrode pad; and (c) flip chip bonding the bump electrodes of the semiconductor chip and the solder balls of the wiring board to each other. In the flip chip bonding at the step (c), the semiconductor chip is pressed into the wiring board by two-staged pressing, first pressing and second pressing subsequent to the first pressing, to implement the flip chip bonding.

The following is a brief description of the gist of the effect obtained by the representative elements of the invention laid open in this application:

It is possible to reduce the production of solder bridges in flip chip bonding to enhance the joint reliability of the flip chip bonding of a semiconductor device.

BRIEF DESCRIPTION OF THE DRAWINGS

FIG. 2 is a manufacturing flowchart illustrating an example of the structure on the substrate side in the assembly of the semiconductor device illustrated in FIG. 1;

DETAILED DESCRIPTION

Figure 1:
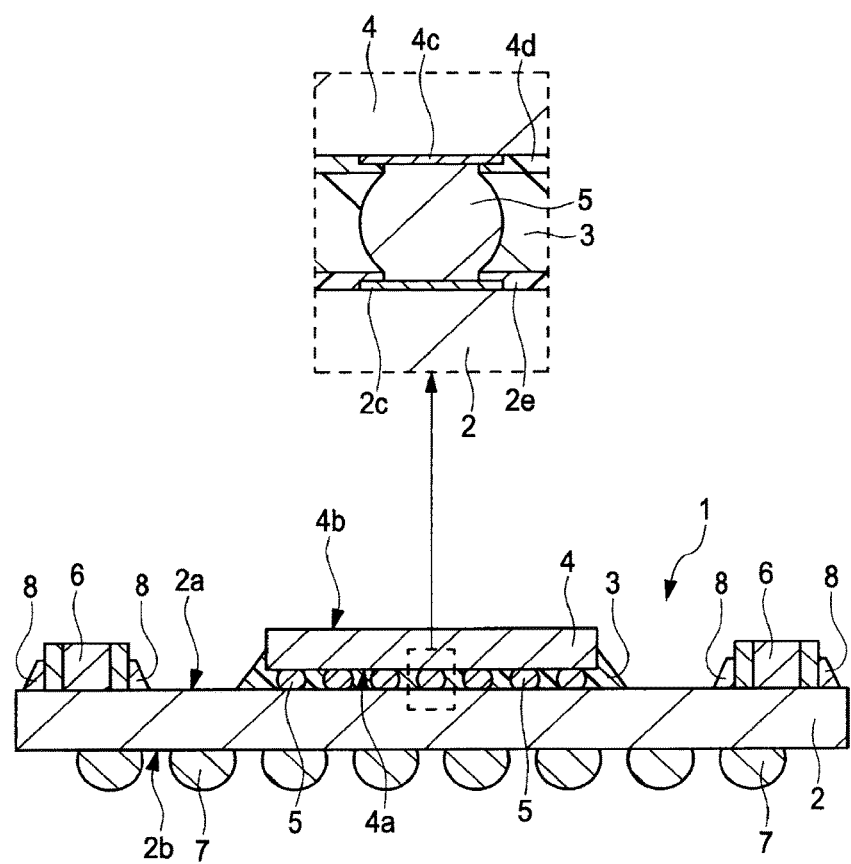
FIG. 1 is a sectional view illustrating an example of the structure of a semiconductor device in a first embodiment of the invention and an enlarged partial sectional view of a flip chip bonded portion.

In the following description of embodiments, the description of an identical or a similar part will not be repeated unless specially required.

In the following description, each embodiment will be divided into multiple sections if necessary for the sake of convenience. Unless explicitly stated otherwise, they are not unrelated to one another and they are in such a relation that one is a modification, details, supplementary explanation, or the like of part or all of the other.

When mention is made of any number of elements (including a number of pieces, a numeric value, a quantity, a range, and the like) in the following description of embodiments, the number is not limited to that specific number. Unless explicitly stated otherwise or the number is obviously limited to a specific number in principle, the foregoing applies and the number may be above or below that specific number.

In the following description of embodiments, needless to add, their constituent elements (including elemental steps and the like) are not always indispensable unless explicitly stated otherwise or they are obviously indispensable in principle.

When the wording of "made up of A," "comprised of A," "having A," or "including A" is used in the following description of embodiments with respect to a constituent element or the like, those including any other element are not excluded, needless to add. This applies unless it is explicitly stated that only element A is included or other like statement is made. Similarly, when mention is made of the shape, positional relation, or the like of a constituent element or the like in the following description of embodiments, it includes those substantially approximate or analogous to that shape, or the like. This applies unless explicitly stated otherwise or it is apparent in principle that some shape or the like does not include those substantially approximate or analogous to that shape or the like. This is the same with the above-mentioned numeric values and ranges.

Hereafter, detailed description will be given to embodiments of the invention with reference to the drawings. In all the drawings illustrating embodiments, members having an identical function will be marked with identical reference numerals and the repetitive description thereof will be omitted.

First Embodiment

Figure 3:
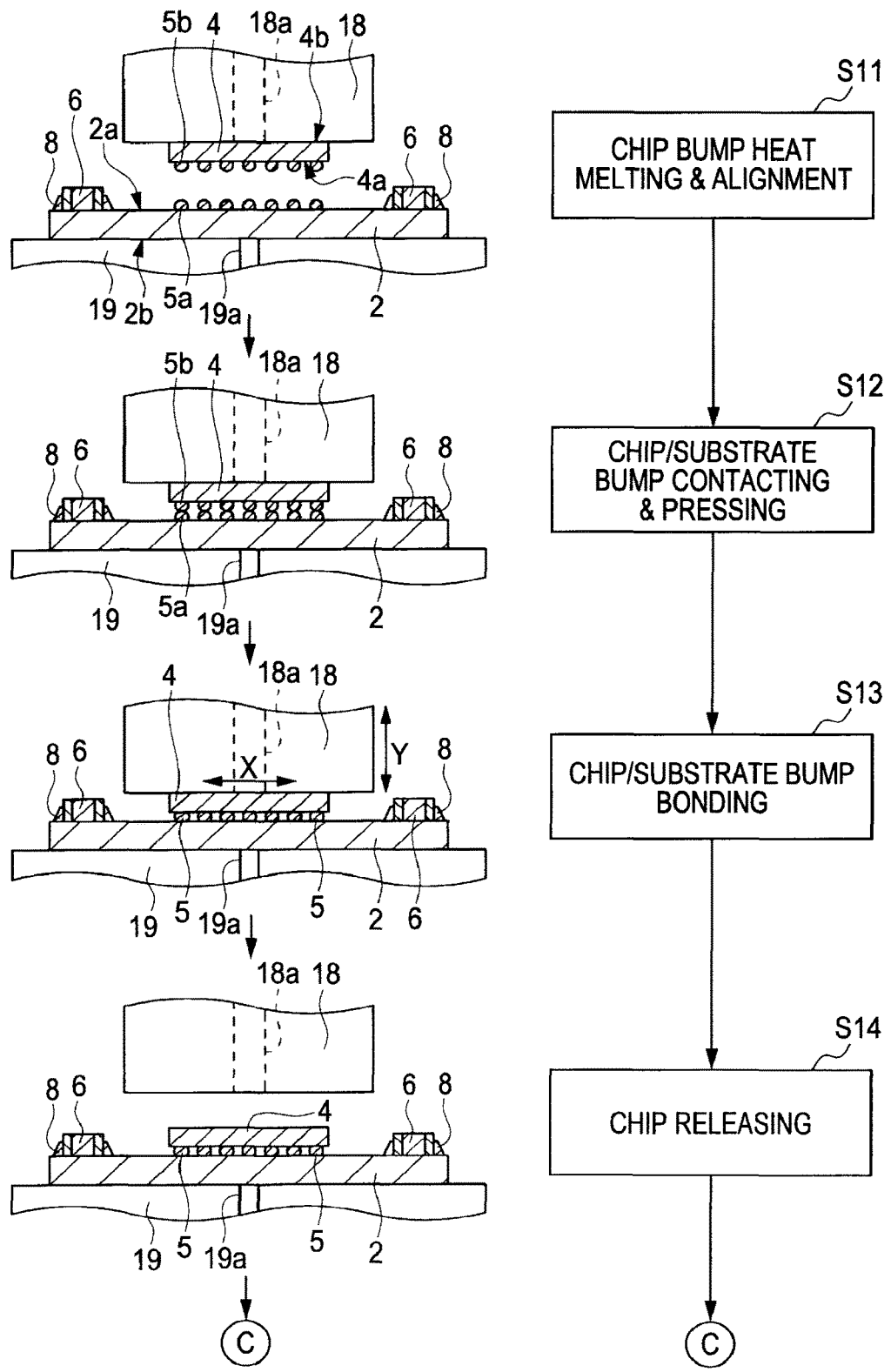
FIG. 3 is a manufacturing flowchart illustrating an example of flip chip bonding in the assembly of the semiconductor device illustrated in FIG. 1.
Figure 4:
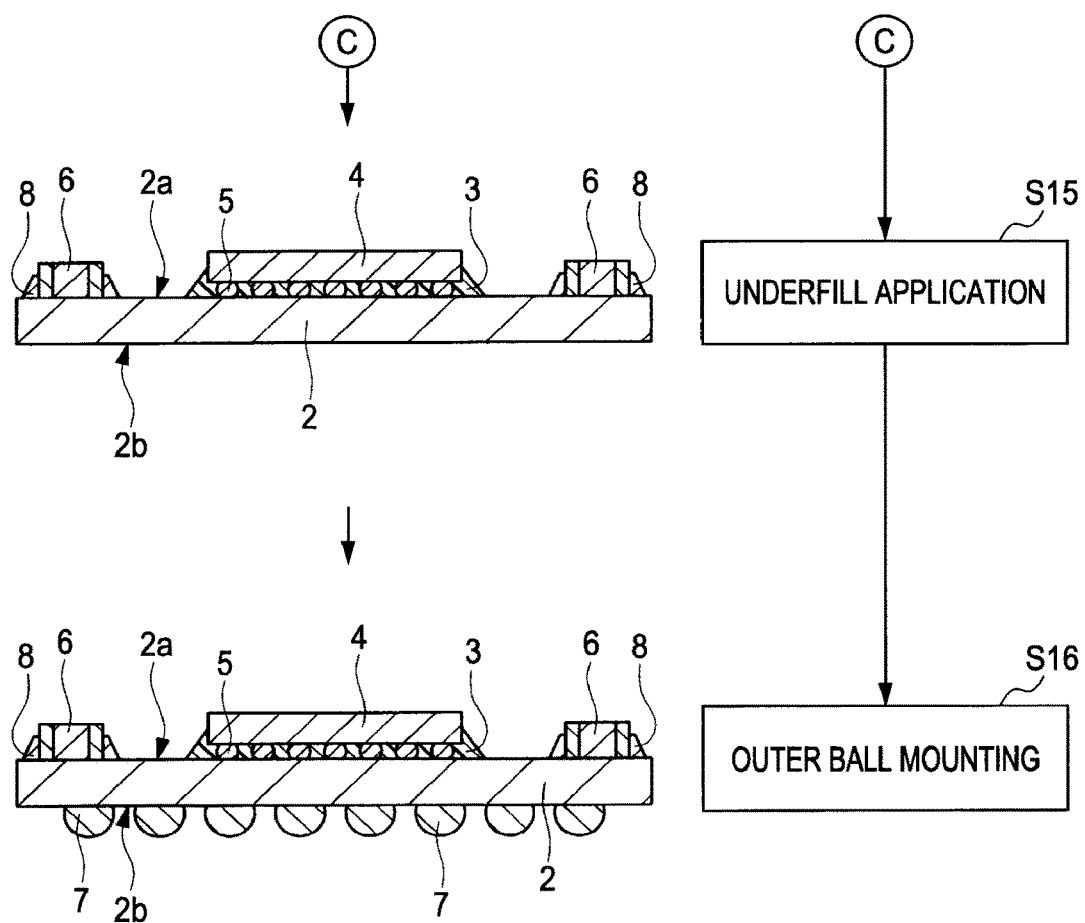
FIG. 4 is a manufacturing flowchart illustrating an example of an underfill application and a ball mounting in the assembly of the semiconductor device illustrated in FIG. 1.

FIG. 1 is a sectional view illustrating an example of the structure of a semiconductor device in the first embodiment of the invention and an enlarged partial sectional view of a flip chip bonded portion; FIG. 2 is a manufacturing flowchart illustrating an example of the manufacture on the substrate side in the assembly of the semiconductor device illustrated in FIG. 1; FIG. 3 is a manufacturing flowchart illustrating an example of flip chip bonding in the assembly of the semiconductor device illustrated in FIG. 1; and FIG. 4 is a manufacturing flowchart illustrating an example of an underfill application and ball mounting in the assembly of the semiconductor device illustrated in FIG. 1.

As illustrated in FIG. 1, the semiconductor device in the first embodiment is a semiconductor package obtained by placing a semiconductor chip 4 over a substrate by flip chip bonding. In the description of the first embodiment, BGA (Ball Grid Array) 1 will be taken as an example of the semiconductor device.

Description will be given to the configuration of the BGA 1 illustrated in FIG. 1. The BGA 1 includes: a wiring board 2 that is a substrate having an upper surface 2a and a lower surface 2b located on the opposite side thereto; the semiconductor chip 4 placed over the upper surface 2a of the wiring board 2 through multiple solder bumps (bump electrodes, solder balls) 5 and having a semiconductor integrated circuit formed therein; underfill 3 filled around each of the solder bumps 5 and around the side surface of the semiconductor chip 4; and multiple solder balls 7 as external terminals provided over the lower surface 2b of the wiring board 2. The solder balls 7 are arranged, for example, in a lattice pattern in the lower surface 2b of the wiring board 2.

Therefore, electrical signals sent from the semiconductor chip 4 are transmitted to solder balls 7 over the lower surface 2b of the wiring board 2 through solder bumps 5 or wiring, through hole wiring, or the like, not shown, in the wiring board 2.

The semiconductor chip 4 has: a main surface 4a in which multiple electrode pads 4c as surface electrodes are respectively formed in openings in a protective film 4d; and a back surface 4b located on the opposite side to the main surface 4a. The semiconductor chip 4 is electrically coupled with the wiring board 2 by flip chip bonding. As illustrated in the enlarged partial sectional view in FIG. 1, that is, the semiconductor chip 4 is electrically coupled with the electrodes 2c for flip chip bonding of the wiring board 2 through the solder bumps 5 respectively electrically coupled to the electrode pads 4c. Since the semiconductor chip 4 is placed over the wiring board 2 by flip chip bonding, it is face-down mounted over the wiring board 2. The upper surface 2a of the wiring board 2 and the main surface 4a of the semiconductor chip 4 are opposed to each other; therefore, the back surface 4b of the semiconductor chip 4 faces upward.

Electronic components, such as chip components 6, are mounted around the semiconductor chip 4 in the upper surface 2a of the wiring board 2. The chip components 6 are, for example, a chip capacitor and a chip resistor and are solder mounted over the wiring board 2 through solder 8.

Description will be given to a manufacturing method for the semiconductor device in the first embodiment.

First, a wiring board preparation of Step S1 in FIG. 2 is carried out. As illustrated in FIG. 1, the wiring board 2 has an upper surface 2a and a lower surface 2b located on the opposite side to the upper surface 2a. In addition, multiple electrodes 2c for flip chip bonding are formed in the upper surface 2a. The wiring board 2 is a substrate that underwent wiring formation, surface insulating layer formation, land surface layer processing, and the like. In the description of the first embodiment, attention will be paid mainly to the state of the surfaces of the bumps for chip bonding.

Thereafter, a solder paste application of Step S2 is carried out. At this step, solder paste for flip chip bonding is applied. That is, to form the bumps for chip bonding, solder paste 10 is applied to the electrodes 2c for flip chip bonding illustrated in FIG. 1. The solder paste 10 is, for example, a paste material containing flux and solder at a volume ratio of approximately 50%. The solder paste 10 is applied to each electrode 2c for flip chip bonding from above by a print process using a metal mask.

Thereafter, a reflow/cleaning of Step S3 is carried out. At this step, heat treatment is carried out using a nitrogen reflow furnace with the oxygen concentration controlled to, for example, 100 ppm or below. Solder bumps (solder balls) 5a are thereby formed over the predetermined electrodes 2c for flip chip bonding. Further, flux cleaning is carried out to remove flux.

Thereafter, a solder paste application of Step S4 is carried out. At this step, for example, the solder paste 10 for peripheral element placement is applied only to areas where a peripheral element is to be placed by a print process using a metal mask.

Thereafter, peripheral element placement & reflow/cleaning of Step S5 is carried out. At this step, electronic components, such as chip components 6, are placed over the solder paste 10 and the reflow/cleaning (flux cleaning) is carried out by the same method as the reflow/cleaning of Step S3 to solder mount the chip components 6 over the wiring board 2.

Thereafter, a flux application of Step S6 is carried out. At this step, flux 9 is applied to the solder bumps 5a over the electrodes 2c for flip chip bonding. Further, a reflow/cleaning of Step S7 is carried out. That is, the flux 9 is applied to the solder bumps 5a for flip chip bonding and then reflow and cleaning processing is carried out.

In the assembly of the semiconductor device in the first embodiment, the following can be implemented by the flux application and reflow/cleaning (flux cleaning) after the completion of the mounting of the chip components 6: reflow processing can be carried out without the flux 9 left over the solder bumps 5a for flip chip bonding. Therefore, the thick and nonuniform surface oxide film over the solder bumps 5a can be turned into a thin and uniform surface oxide film.

Each of the solder bumps 5a for flip chip bonding is 80 µm in bump diameter and 50 µm in bump height when the bump pitch is, for example, 150 µm. Since it is necessary to minimize variation in bump height, it is required to supply solder with accuracy. In addition, the bump placement surface must be flat. Therefore, it is desirable to take the procedure shown in the flow in FIG. 2. That is, it is desirable that the solder bumps 5a for flip chip bonding should be formed first and then peripheral elements (electronic components), such as chip components 6, should be placed.

In this case, that is, the order of the placement of peripheral elements and the formation of solder bumps 5a for flip chip bonding is critical. This is the same also when any formation method other than a solder paste print process is adopted to form the solder bumps 5a for flip chip bonding at Steps S2 and S3.

The same effect is obtained even when flip chip bonding is carried out using the following solder bumps: solder bumps 5a obtained by subjecting bumps formed beforehand to reflow processing without carrying out anti-oxidation processing, such as flux application, and thereafter applying flux and carrying out the reflow/cleaning again.

After the wiring board 2 is prepared by the assembly illustrated in FIG. 2, flip chip bonding is carried out by the assembly illustrated in FIG. 3.

First, a semiconductor chip 4 with multiple solder bumps 5b respectively formed over the electrode pads 4c illustrated in FIG. 1 is prepared. As illustrated in FIG. 3, thereafter, the solder bumps (bump electrodes) 5b of the semiconductor chip 4 and the solder bumps (solder balls) 5a of the wiring board 2 are (fluxless) flip chip bonded to each other.

In the flip chip bonding, first, a chip bump heat melting & alignment of Step S11 in FIG. 3 is carried out. First, the wiring board 2 is positioned in a predetermined position in the supporting surface of a bonding stage 19 heated to a temperature close to a solder melting point and placed there. The bonding stage 19 is provided with an exhaust system 19a and is exhausted to vacuum through this exhaust system 19a to suck and hold the wiring board 2.

Meanwhile, the back surface 4b of the semiconductor chip 4 is sucked and held by the suction surface of a bonding head 18 preheated to a predetermined preheat temperature higher than the solder melting point. The bonding head 18 is provided with an exhaust system 18a and is exhausted to vacuum through this exhaust system 18a to suck and hold the semiconductor chip 4. The semiconductor chip 4 is positioned (aligned) in a predetermined position by the movement of the bonding head 18 in the horizontal direction and in this state, it is positioned above the wiring board 2. Since the bonding head 18 is heated to the predetermined preheat temperature higher than the solder melting point, in this state, the solder bumps 5(5b) formed over the semiconductor chip 4 are melted.

Thereafter, a chip/substrate bump contacting & pressing of Step S12 is carried out. At this step, the bonding head 18 is moved down to place the semiconductor chip 4 over the wiring board 2 in a predetermined position. That is, the semiconductor chip 4 is placed so that the solder bumps 5a on the substrate side and the solder bumps 5b on the chip side are aligned with each other. Since the semiconductor chip 4 is sucked to the suction surface of the bonding head 18, it is moved down in the vertical direction as is positioned in the horizontal direction. The semiconductor chip 4 is held for a predetermined time with a predetermined distance maintained between the wiring board 2 and the semiconductor chip 4 and is thereby flip chip placed over the wiring board 2.

As a result, the solder bumps 5b formed over the semiconductor chip 4 and the solder bumps 5a formed over the wiring board 2 are brought into contact with each other. Further, the solder bumps 5b on the chip side are pressed into the solder bumps 5a on the substrate side. The solder bumps 5a on the substrate side are heated by the solder bumps 5b on the chip side and their temperature becomes equal to or higher than the solder melting point.

As shown in the illustration of a chip/substrate bump bonding of Step S13, thereafter, the integrated and melted solder bumps 5 are periodically rhythmically vibrated (scrubbed) either in the horizontal direction X or in the vertical direction Y.

As a result, the oxide film covering the surfaces of the solder bumps 5 is broken and taken into the solder bumps 5 and thus flip chip bonding is achieved.

As shown in the illustration of, a chip releasing of Step S14, the suction of the semiconductor chip 4 to the bonding head 18 is canceled and the bonding head 18 is moved up to complete flip chip bonding.

After the completion of flip chip bonding, an underfill application of Step S15 in FIG. 4 is carried out. At this step, underfill 3 is dripped to the side of the semiconductor chip 4 to fill the gap between the semiconductor chip 4 and the wiring board 2 with the underfill 3. That is, the underfill 3 is filled to the flip chip bonded portions and it is also supplied to the side surface of the semiconductor chip 4 to cover the periphery of the semiconductor chip 4 with the underfill 3. The flip chip bonded portions and the semiconductor chip 4 are thereby protected.

Thereafter, an outer ball mounting of Step S16 is carried out. At this step, the lower surface 2b of the wiring board 2 is provided with a predetermined number of solder balls (external terminals) 7.

This completes the assembly of the BGA 1.

According to the BGA 1 in the first embodiment and the assembly thereof, the flux 9 is applied to the solder bumps 5a for flip chip bonding over the substrate before fluxless flip chip bonding is carried out. In addition, after the reflow/cleaning (flux cleaning) is carried out, flip chip bonding is carried out. Thus the flip chip bonding can be achieved with the oxide film over the surfaces of the solder bumps 5a made relatively thin and uniform.

That is, the surface oxide film of the solder bumps 5a can be made uniform by forming the solder bumps 5a of the solder paste 10 and thereafter applying the flux 9 again and carrying out the reflow/cleaning (flux cleaning) again.

As mentioned above, the surface oxide film of the solder bumps 5a on the substrate side is made uniform before fluxless flip chip bonding is carried out. As a result, the shape of solder protrusions outward of solder when the solder bumps 5a are pressed is spread (concentrically) all around the bumps (balls) by the surface tension of molten solder. Or, the solder protrusions take on such a shape that their tips are rounded.

That is, it is possible to prevent the production of local solder protrusions 5c and reduce the production of a solder bridge between adjacent bumps during fluxless flip chip bonding.

As a result, it is possible to enhance the joint reliability in flip chip bonding of the BGA 1 (semiconductor device).

As mentioned above, solder protrusions produced at the time of solder pressing can be provided with an entire circumferential shape (concentric shape) or a rounded shape. As a result, the gap between chip and substrate where a bridge between adjacent bumps is produced is reduced and it is possible to increase the amount of solder pressing. Since the oxide film over the surfaces of the solder bumps is relatively thin and uniform, the oxide film over the surfaces of the solder bumps is easy to break and it is possible to reduce the amount of solder pressing required for bonding. As a result, it is possible to ensure a large area for pressing solder so that bonding can be achieved.

The BGA 1 is a semiconductor device having a structure in which chip components 6 are solder mounted around the semiconductor chip 4. That is, after the solder bumps 5a for flip chip bonding are formed by the reflow/cleaning, the solder 8 for the chip components 6 are subjected to the reflow/cleaning. At this stage, the solder bumps 5a are heated and melted without flux and their surface oxide film is increased in thickness. Therefore, the surface oxide film of the solder bumps 5a is not uniform. In the BGA 1 in the first embodiment, however, the flux 9 is applied to the solder bumps 5a and the reflow/cleaning (flux cleaning) is carried out again before flip chip bonding is carried out. Therefore, the surface oxide film of the solder bumps 5a can be made relatively thin and uniform by the oxide film removing effect of flux before flip chip bonding. That is, the following can be implemented even in the BGA 1 having such a structure that electronic components, such as chip components 6, are solder mounted around the semiconductor chip 4: the production of solder bridges can be reduced to enhance the joint reliability in flip chip bonding.

In the assembly of the BGA 1 in the first embodiment, the melted solder bumps 5b on the chip side are brought into contact with and pressed into the solder bumps 5a on the substrate side during flip chip bonding. When the bumps at least on either side are melted during flip chip bonding, as mentioned above, protruded bumps are prone to be formed at the time of bump pressing.

Figure 32:
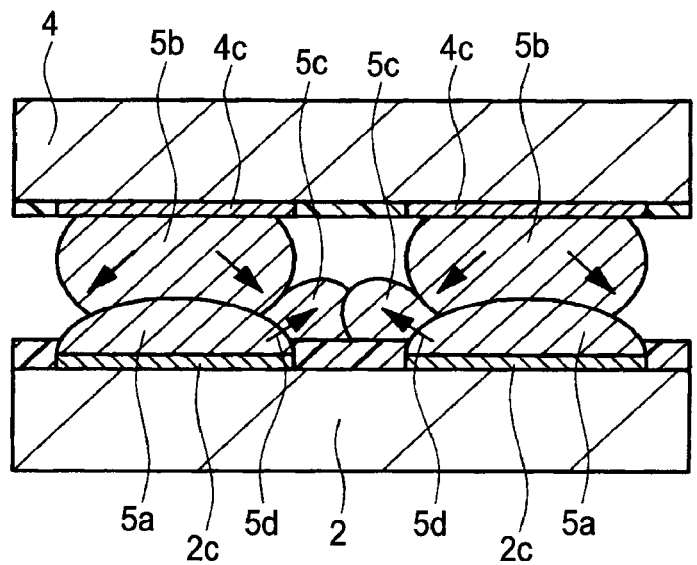
FIG. 32 is an enlarged partial sectional view illustrating the procedure for fluxless flip chip bonding in the comparative example.
Figure 33:
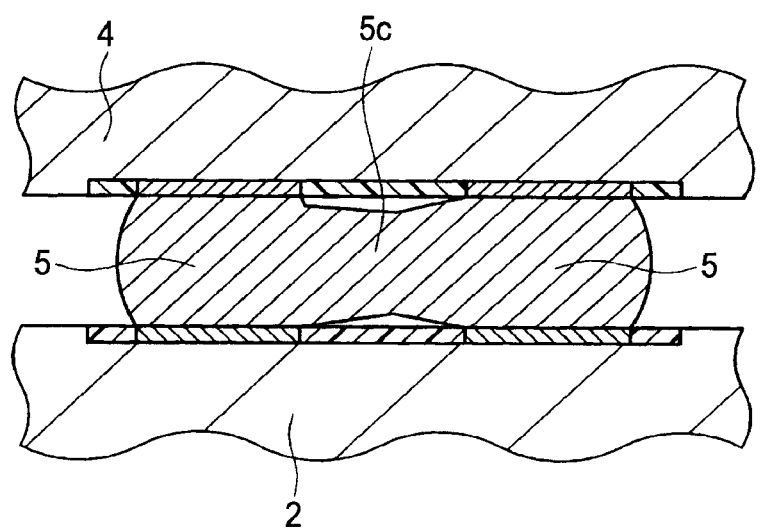
FIG. 33 is an enlarged partial sectional view illustrating the structure of a solder bridge formed during the fluxless flip chip bonding in the comparative example.

The reason for this is as follows. When molten solder bumps are brought into contact with and pressed into unmelted solder bumps, the molten solder is concavely deformed and the unmelted solder is convexly deformed so that the melted solder covers the unmelted solder. As a result, the temperature of the unmelted solder bumps is rapidly raised and they are prevented from being uniformly deformed outward after melting. As a result, such local solder protrusions 5c as illustrated in FIG. 32 are formed and this is likely to lead to solder bridges between adjacent bumps.

The flip chip bonding of the BGA 1 in the first embodiment is carried out after the following procedure is taken: the solder bumps 5a on the substrate side are subjected to the flux application and the reflow/cleaning again to make uniform the surface oxide film of the solder bumps 5a. Therefore, the following can be implemented even when the bumps on either side are melted: the solder protrusions can be spread (concentrically) all around the bumps by the surface tension of the molten solder and the production of solder bridges can be reduced.

Description will be given to a first modification to the first embodiment.

Figure 5:
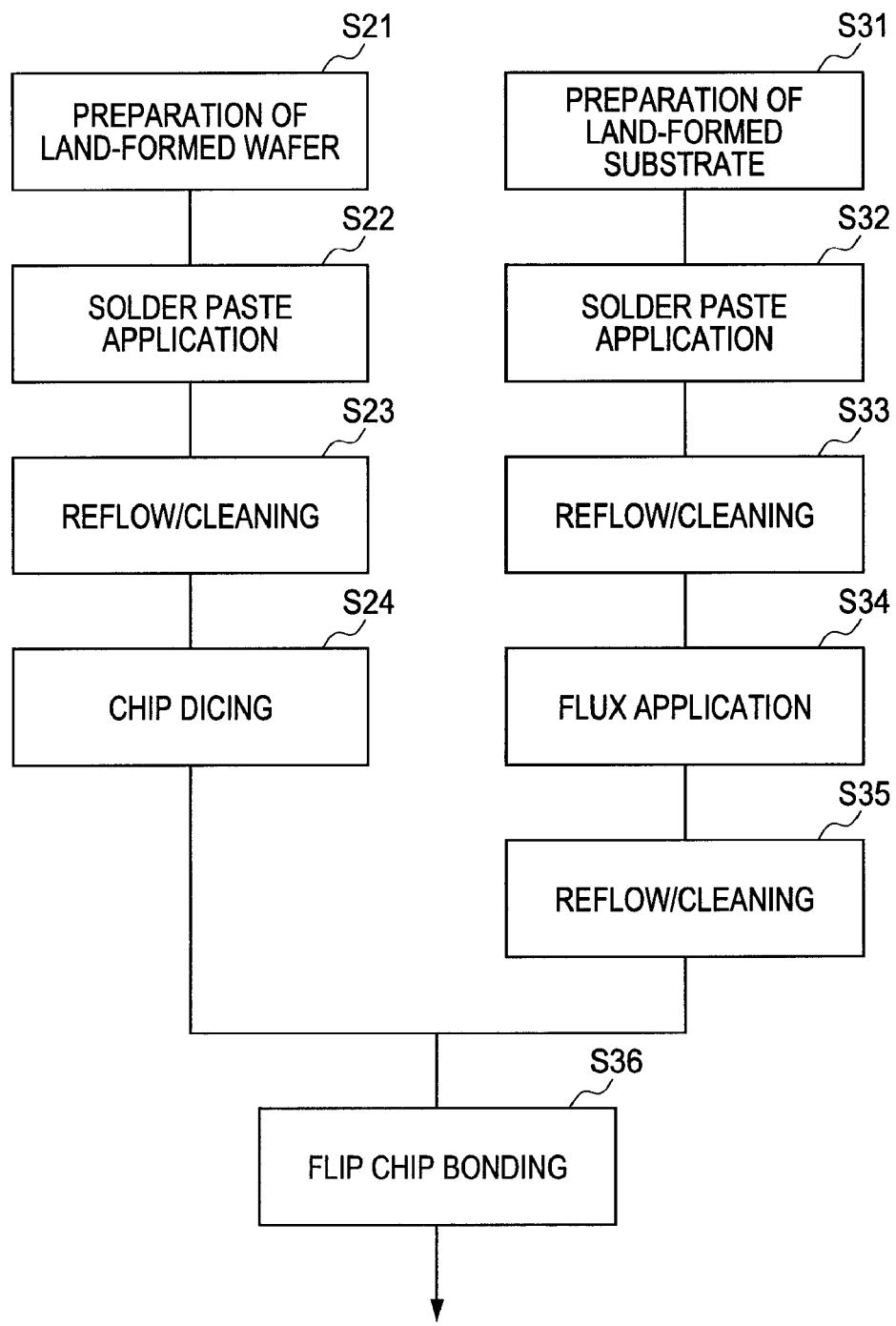
FIG. 5 is a flowchart illustrating a first modification to the assembly of a semiconductor device in the first embodiment of the invention.
Figure 6:
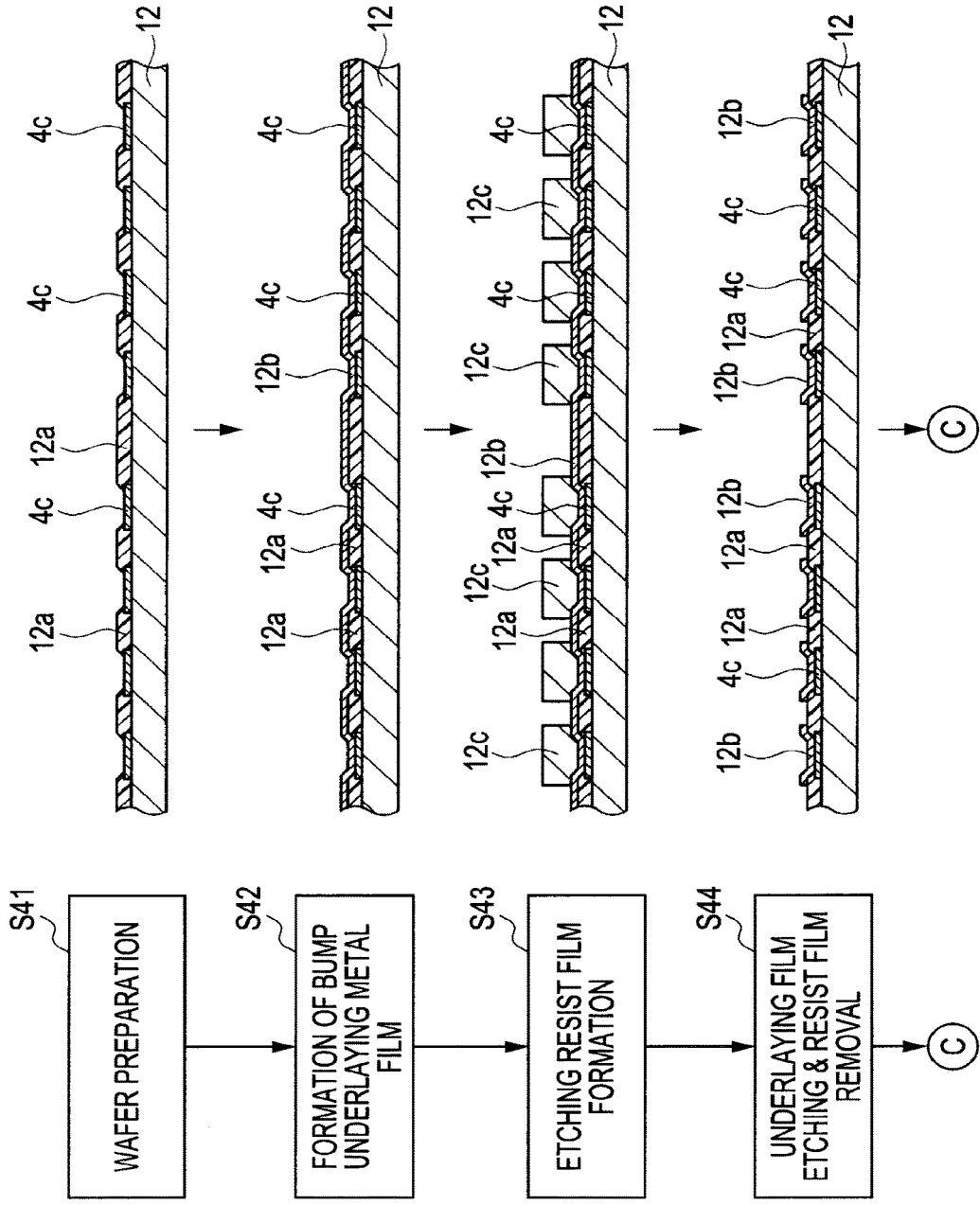
FIG. 6 is a manufacturing flowchart illustrating part of the assembly on the chip side in the flow illustrated in FIG. 5.
Figure 7:
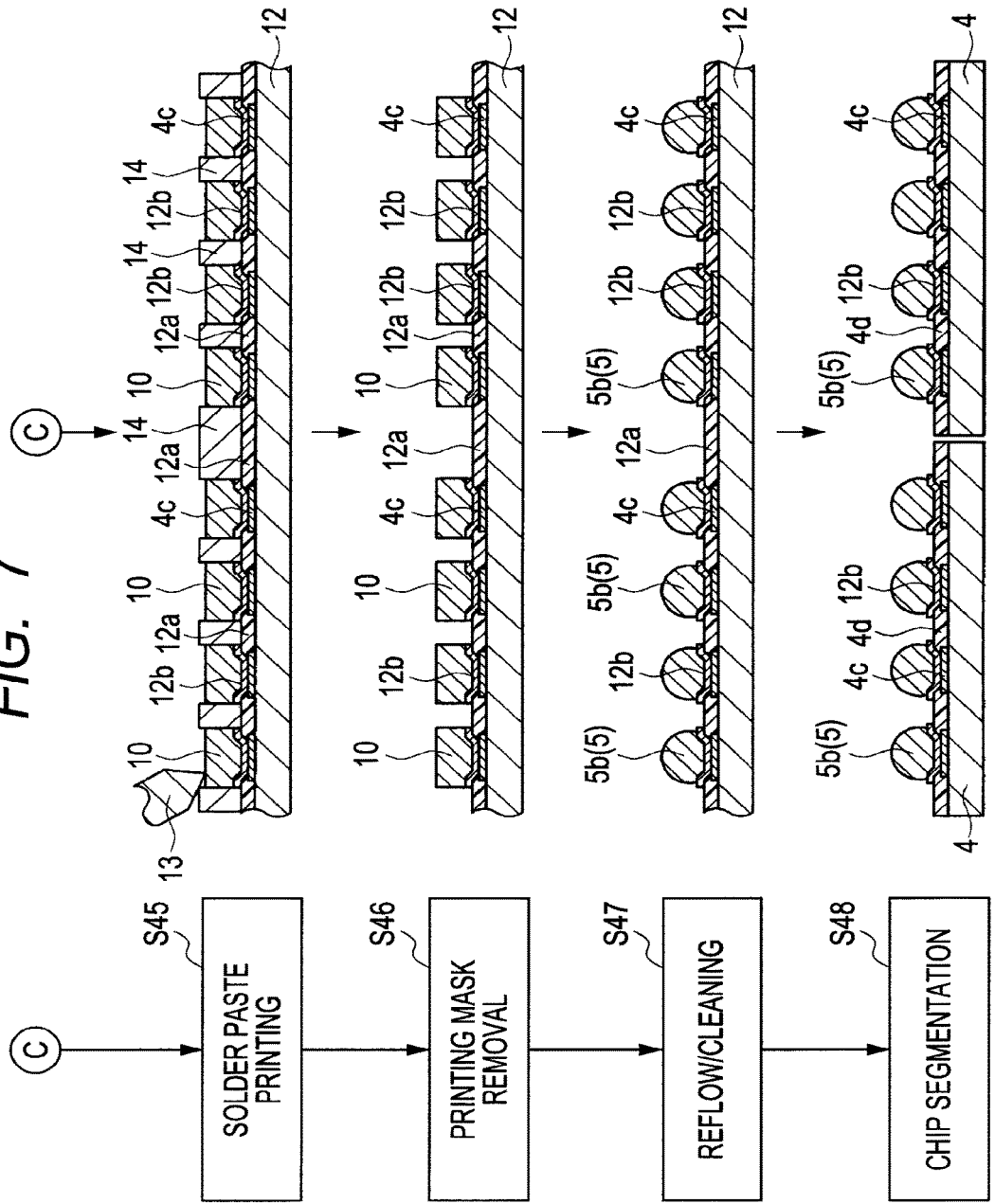
FIG. 7 is a manufacturing flowchart illustrating part of the assembly on the chip side in the flow illustrated in FIG. 5.
Figure 8:
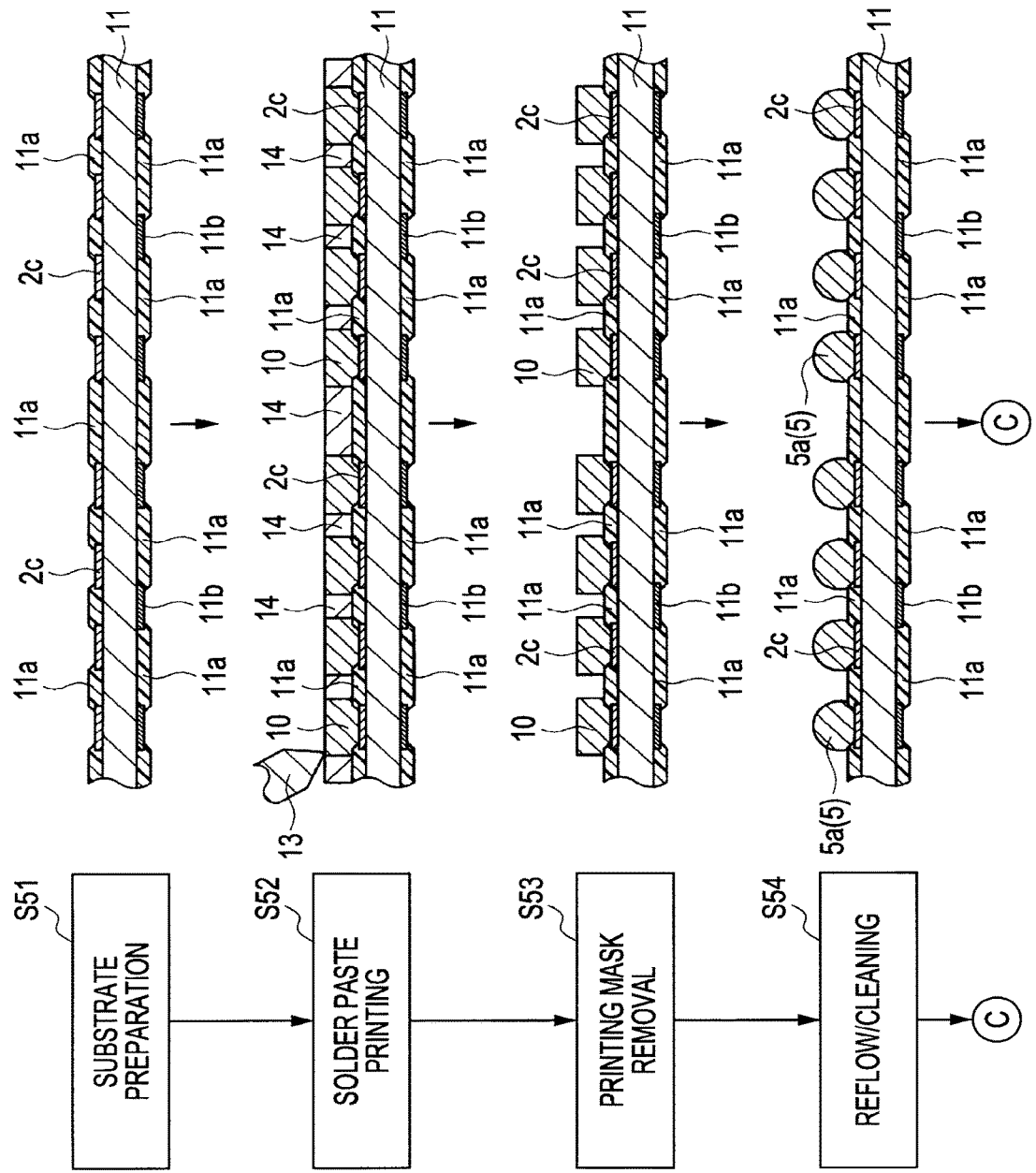
FIG. 8 is a manufacturing flowchart illustrating part of the assembly on the substrate side in the flow illustrated in FIG. 5.
Figure 9:
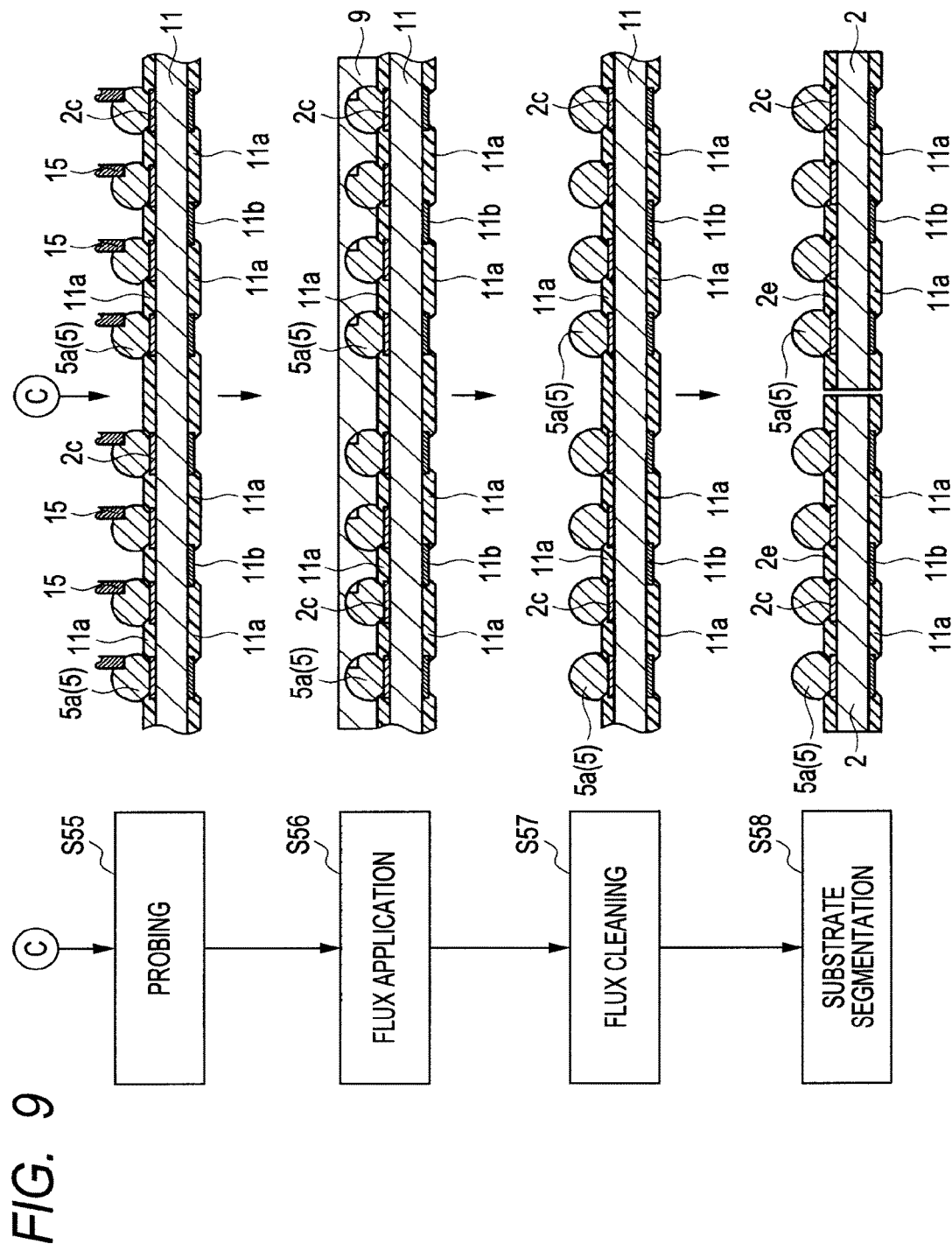
FIG. 9 is a manufacturing flowchart illustrating part of the assembly on the substrate side in the flow illustrated in FIG. 5.

FIG. 5 is a flowchart illustrating the first modification to the assembly of the semiconductor device in the first embodiment of the invention; FIG. 6 is a manufacturing flowchart illustrating part of the assembly on the chip side in the flow illustrated in FIG. 5; FIG. 7 is a manufacturing flowchart illustrating part of the assembly on the chip side in the flow illustrated in FIG. 5; FIG. 8 is a manufacturing flowchart illustrating part of the assembly on the substrate side in the flow illustrated in FIG. 5; and FIG. 9 is a manufacturing flowchart illustrating part of the assembly on the substrate side in the flow illustrated in FIG. 5.

The first modification is an example of assembly in which the following procedure is taken: the solder bumps 5b on the chip side are formed by a printing method and the flux application and the reflow/cleaning are carried out only on the solder bumps 5a on the substrate side.

First, description will be given to the formation of bumps for flip chip bonding on the chip side. A preparation of land-formed wafer of Step S21 in FIG. 5 is carried out. At this step, a wafer (semiconductor wafer) 12 including multiple electrode pads 4c as aluminum electrodes and a protective film 12a for protecting the surface thereof is prepared by wafer preparation of Step S41 in FIG. 6.

Thereafter, a formation of bump underlaying metal film of Step S42 is carried out. At this step, a bump underlaying metal film 12b is formed over the electrode pads 4c and protective film 12a over the surface of the wafer 12. For example, Ti, NiV, Cu, or the like is used for the bump underlaying metal film.

Thereafter, an etching resist film formation of Step S43 is carried out. At this step, an etching resist film 12c is formed in multiple bump placement portions for flip chip bonding.

Thereafter, underlaying film etching & resist film removal of Step S44 is carried out. First, using the etching resist film 12c as a mask, etching is carried out to remove the unnecessary portions of the bump underlaying metal film 12b and then the etching resist film 12c is removed. This establishes a state in which the bump underlaying metal film 12b is formed over each electrode pad 4c in the wafer 12.

Thereafter, solder paste application of Step S22 in FIG. 5 is carried out. At this step, solder paste 10 is formed over the bump underlaying metal films 12b in the bump placement portions by a print process using a printing mask 14 as a metal mask by solder paste printing of Step S45 in FIG. 7. At this time, first, the printing mask 14 is placed around the bump underlaying metal films 12b as the bump placement portions and then solder paste 10 is printed over the bump underlaying metal films 12b by a print process using a squeegee 13.

Thereafter, a printing mask removal of Step S46 in FIG. 7 is carried out. At this step, the printing mask 14 over the wafer 12 is removed.

Thereafter, reflow/cleaning of Step S23 in FIG. 5 and Step S47 in FIG. 7 is carried out. At this step, the solder paste 10 over the wafer 12 is heated and melted at a predetermined temperature by reflowing and cleaned (flux cleaning) to form multiple solder bumps 5b.

Thereafter, a chip dicing of Step S24 in FIG. 5 (a chip segmentation of Step S48 in FIG. 7) is carried out. At this step, the wafer is diced into a chip size to form semiconductor chips 4 each having multiple solder bumps 5b placed therein.

With respect to the thickness of each semiconductor chip 4, wafer back surface polishing is carried out to a predetermined wafer thickness after or before the formation of the solder bumps 5b. Thus a desired chip thickness can be obtained.

Description will be given to the formation of bumps for flip chip bonding on the substrate side. A preparation of land-formed substrate of Step S31 in FIG. 5 is carried out. At this step, the following matrix arrayed substrate 11 having a plurality of device forming areas is prepared by a substrate preparation of Step S51 in FIG. 8: a matrix arrayed substrate 11 having a plurality of device forming areas as a multilayer wiring board including multiple electrodes 2c for flip chip bonding as copper lands, a solder resist film 11a for protecting the surface thereof, and multiple land terminals 11b formed on the back surface side.

Thereafter, a solder paste application of Step S32 in FIG. 5 is carried out. At this step, solder paste 10 is formed over the multiple electrodes 2c for flip chip bonding by a print process using a printing mask 14 as a metal mask by a solder paste printing of Step S52 in FIG. 8. The solder paste 10 is, for example, a paste material containing flux and solder at a volume ratio of approximately 50%. First, the printing mask 14 is placed around the electrodes 2c for flip chip bonding and then the solder paste 10 is printed over the electrodes 2c for flip chip bonding by a print process using a squeegee 13.

Thereafter, a printing mask removal of Step S53 in FIG. 8 is carried out. At this step, the printing mask 14 over the matrix arrayed substrate 11 having a plurality of device forming areas is removed.

Thereafter, reflow/cleaning of Step S33 in FIG. 5 and Step S54 in FIG. 8 is carried out. At this step, the solder paste 10 over the electrodes 2c for flip chip bonding of the matrix arrayed substrate 11 having a plurality of device forming areas is heated and melted at a predetermined temperature by reflowing and cleaned to form multiple solder bumps 5a.

Thereafter, a probing of Step S55 in FIG. 9 is carried out. At this step, a probe 15 is brought into contact with the multiple solder bumps 5a over the matrix arrayed substrate 11 having a plurality of device forming areas to conduct electrical testing.

Thereafter, a flux application of Step S34 in FIG. 5 (Step S56 in FIG. 9) is carried out. That is, flux 9 is applied (re-applied) so as to cover the multiple solder bumps 5a provided over the matrix arrayed substrate 11 having a plurality of device forming areas.

Thereafter, reflow/cleaning of Step S35 in FIG. 5 (flux cleaning of Step S57 in FIG. 9) is carried out. That is, the solder bumps 5a over the matrix arrayed substrate 11 having a plurality of device forming areas with the flux 9 applied thereto are heated and cleaned (flux cleaning) at a predetermined temperature by reflowing. This makes it possible to eliminate variation in bump height due to a probing mark, thin the surface oxide film sticking to each of the solder bumps 5a, and make the surface oxide film uniform.

Thereafter, a substrate segmentation of Step S58 in FIG. 9 is carried out to form wiring boards 2 each having multiple solder bumps 5a for flip chip bonding placed therein.

Thereafter, a flip chip bonding of Step S36 in FIG. 5 is carried out. At this step, flip chip bonding is carried out using the following semiconductor chip and wiring board: a semiconductor chip 4 with multiple solder bumps 5b placed therein shown in the illustration of Step S48 in FIG. 7 and a wiring board 2 with multiple solder bumps 5a placed therein shown in the illustration of Step S58 in FIG. 9.

At this time, the same (fluxless) flip chip bonding method as illustrated as Step S11 to Step S14 in FIG. 3 is used to flip chip bond the following semiconductor chip and wiring board to each other: the semiconductor chip 4 shown in the illustration of Step S48 in FIG. 7 and the wiring board 2 shown in the illustration of Step S58 in FIG. 9. This completes the assembly.

Description will be given to a second modification to the first embodiment.

Figure 10:
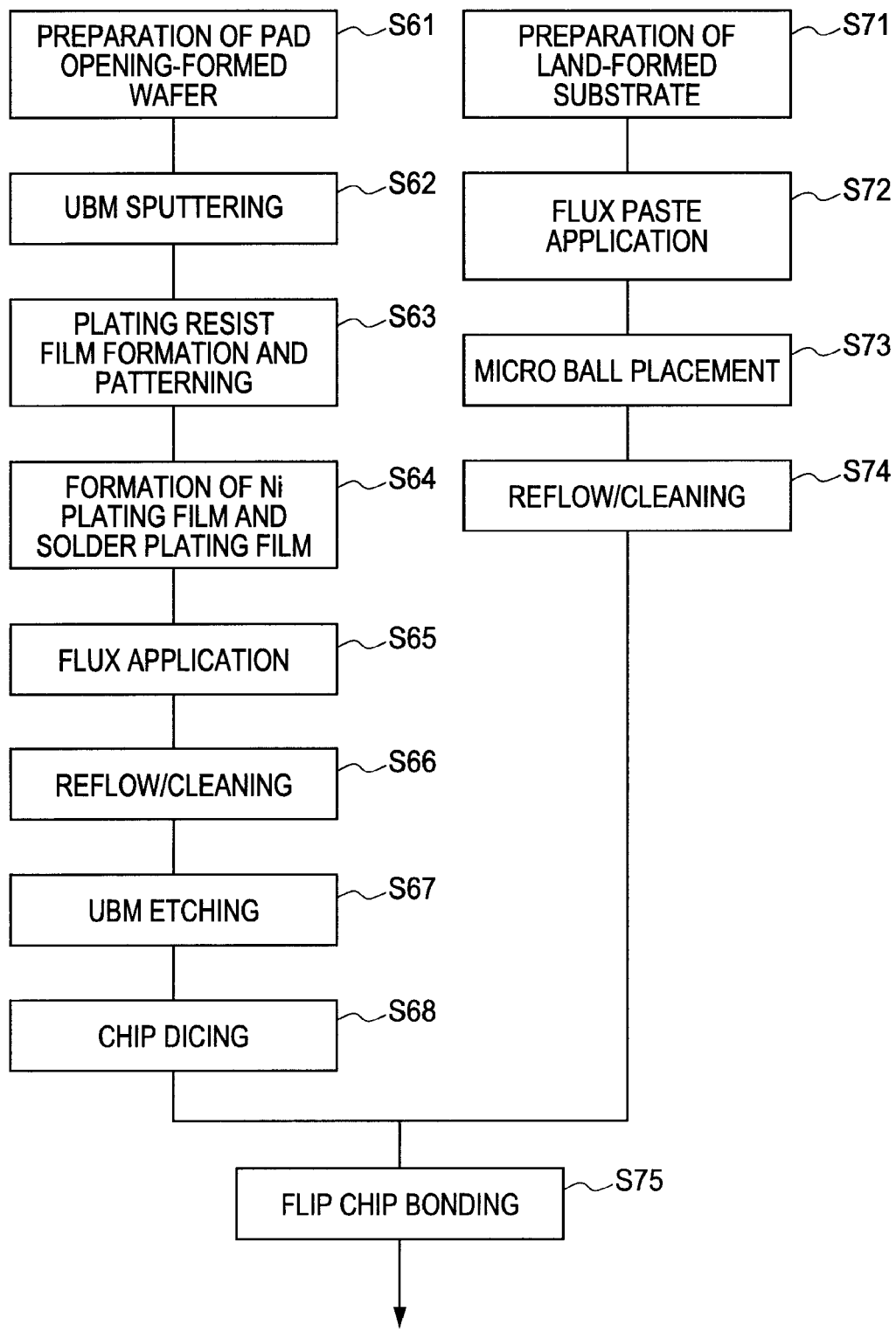
FIG. 10 is a flowchart illustrating a second modification to the assembly of a semiconductor device in the first embodiment of the invention.
Figure 11:
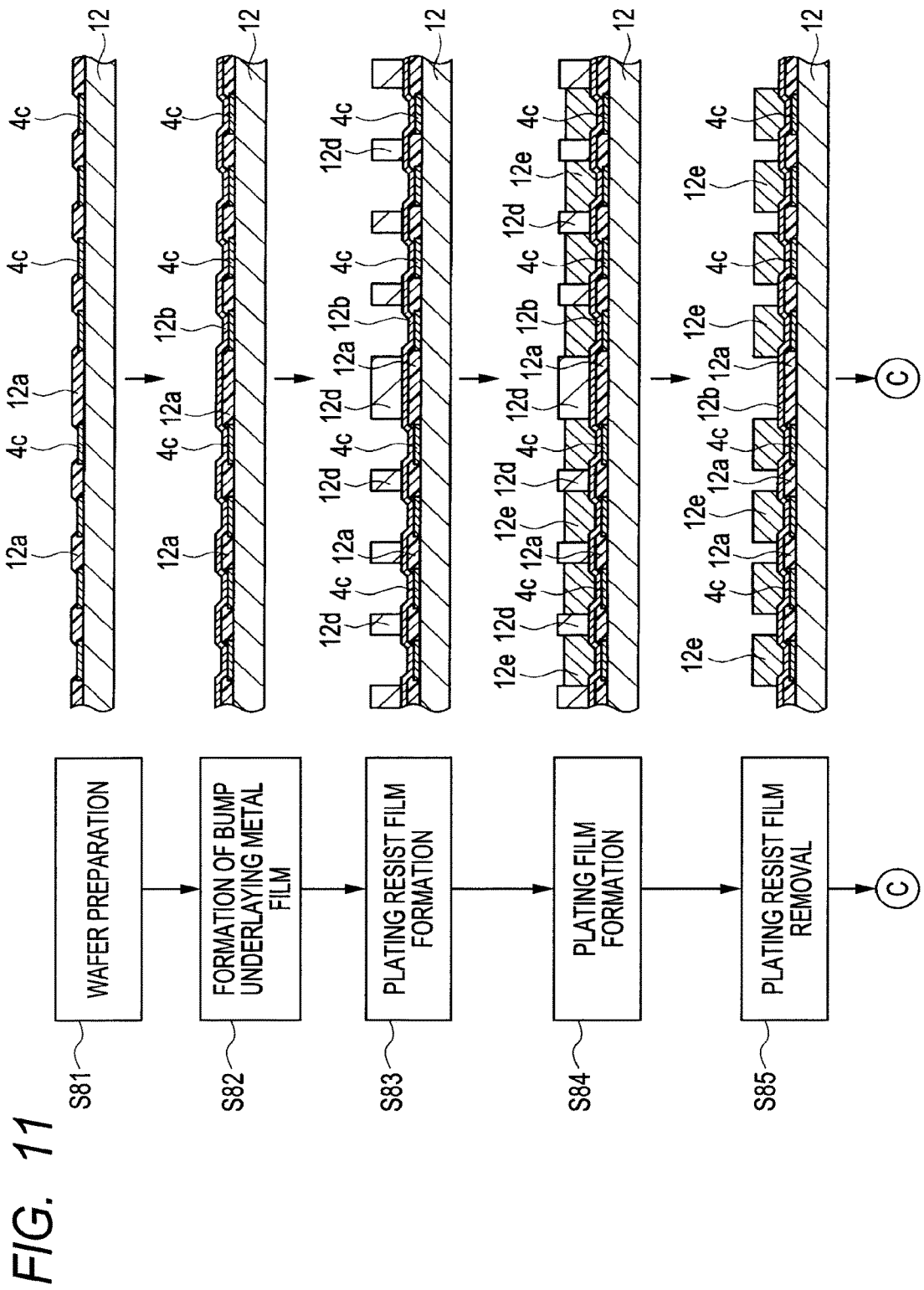
FIG. 11 is a manufacturing flowchart illustrating part of the assembly on the chip side in the flow illustrated in FIG. 10.
Figure 12:
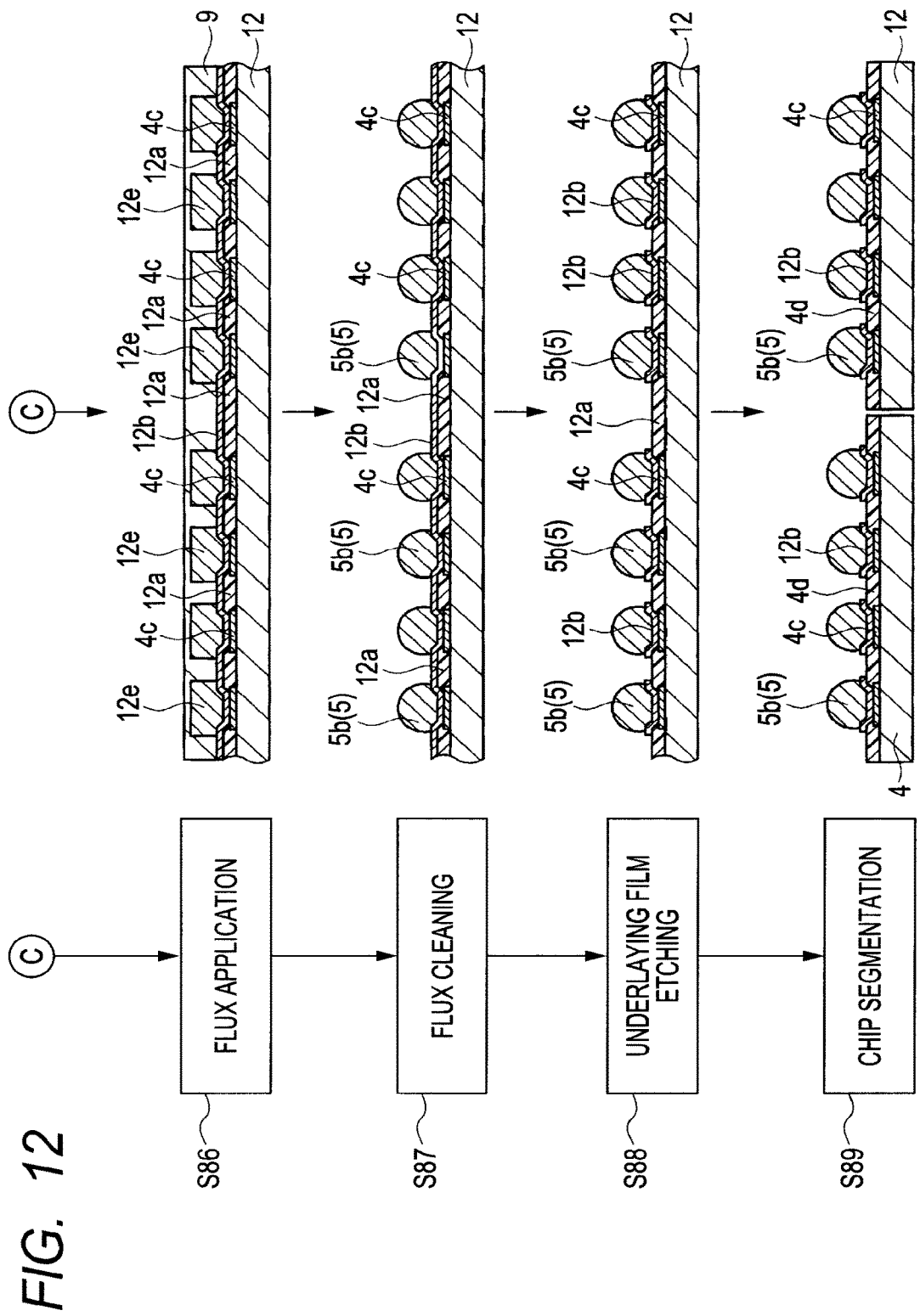
FIG. 12 is a manufacturing flowchart illustrating part of the assembly on the chip side in the flow illustrated in FIG. 10.
Figure 13:
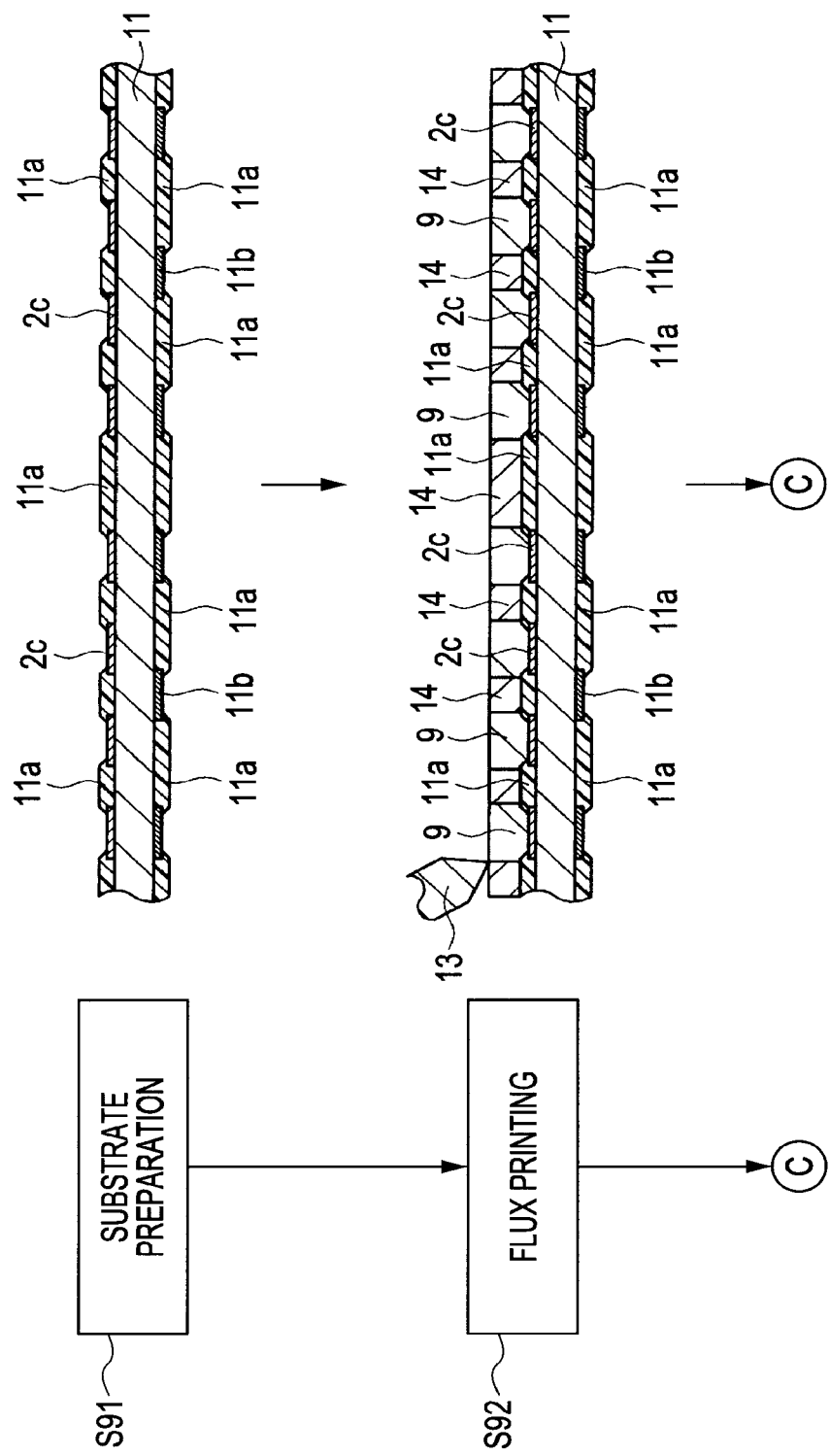
FIG. 13 is a manufacturing flowchart illustrating part of the assembly on the substrate side in the flow illustrated in FIG. 10.
Figure 14:
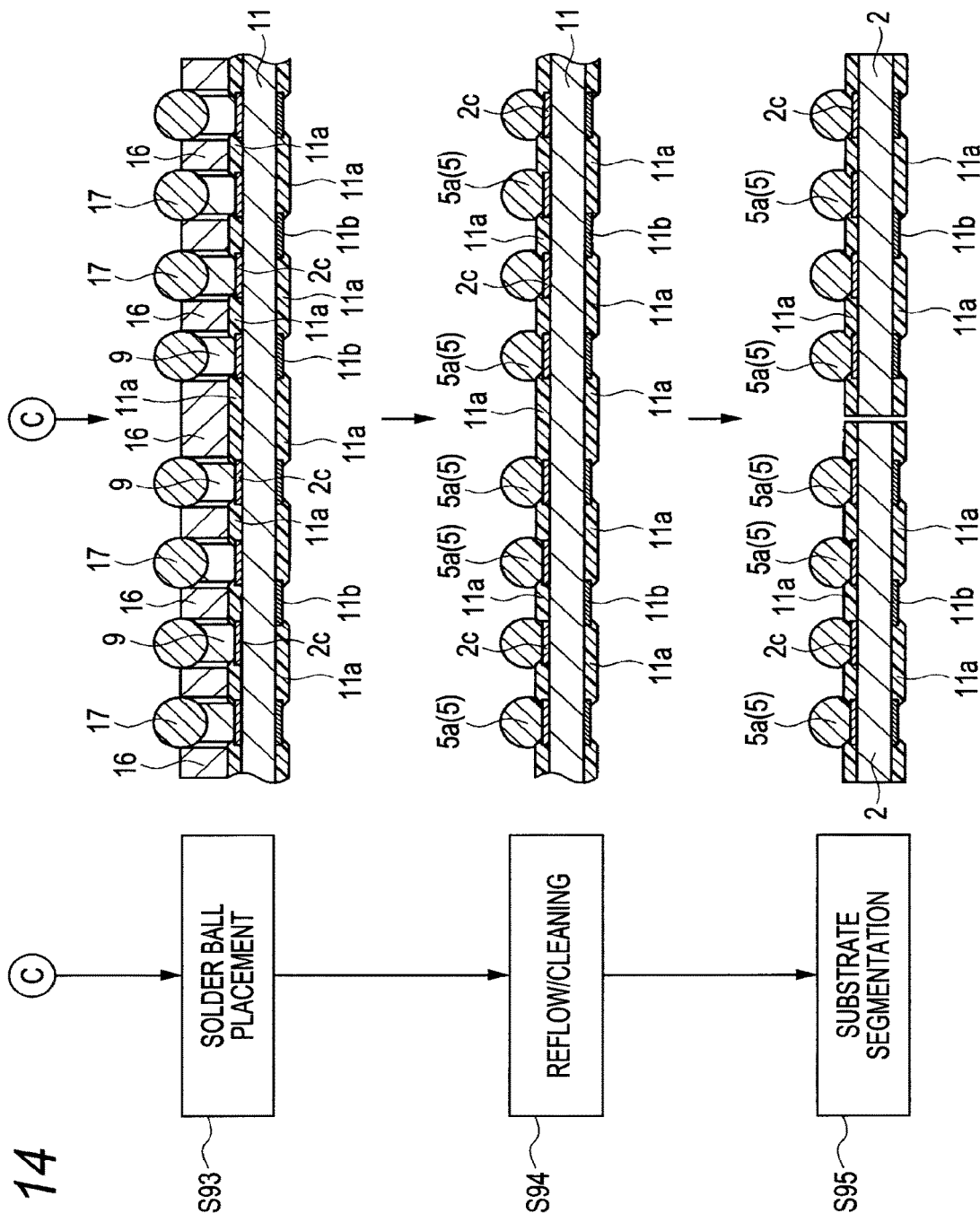
FIG. 14 is a manufacturing flowchart illustrating part of the assembly on the substrate side in the flow illustrated in FIG. 10.

FIG. 10 is a flowchart illustrating the second modification to the assembly of the semiconductor device in the first embodiment of the invention; FIG. 11 is a manufacturing flowchart illustrating part of the assembly on the chip side in the flow illustrated in FIG. 10; FIG. 12 is a manufacturing flowchart illustrating part of the assembly on the chip side in the flow illustrated in FIG. 10; FIG. 13 is a manufacturing flowchart illustrating part of the assembly on the substrate side in the flow illustrated in FIG. 10; and FIG. 14 is a manufacturing flowchart illustrating part of the assembly on the substrate side in the flow illustrated in FIG. 10.

In the second modification, the solder bumps 5b on the chip side are formed by plating and the solder bumps 5a on the substrate side are formed by a micro solder ball placement method. It is an example of assembly in which the flux application and the reflow/cleaning are carried out on the solder bumps 5a on the substrate side.

Description will be given to the formation of bumps for flip chip bonding on the chip side. A preparation of pad opening-formed wafer of Step S61 in FIG. 10 is carried out. At this step, the following wafer (semiconductor wafer) 12 is prepared by a wafer preparation of Step S81 in FIG. 11: a wafer in which multiple electrode pads 4c as bump placement portions and aluminum electrodes and a protective film 12a exposing the electrode pads 4c by openings therein are formed.

Thereafter, a formation of bump underlaying metal film of Step S82 is carried out. At this step, a bump underlaying metal film 12b (UBM) is formed over the entire surface of the wafer 12 by sputtering using the UBM (Under Bump Metal) sputtering of Step S62 in FIG. 10. That is, the bump underlaying metal film 12b is formed over the electrode pads 4c and protective film 12a over the surface of the wafer 12 by sputtering. For example, Ti, Cu, or the like is used for the bump underlaying metal film.

Thereafter, a resist film formation of Step S83 is carried out. At this step, first, plating resist film formation and patterning of Step S63 in FIG. 10 is carried out. That is, a plating resist film 12d is applied to the wafer 12 by a spin coat method and openings are formed in positions corresponding to bump placement portions by a photoengraving process.

Thereafter, a plating film formation of Step S84 is carried out. At this step, formation of Ni plating film and solder plating film of Step S64 in FIG. 10 is carried out. That is, a Ni plating film, not shown, is formed as a solder diffusion barrier over the bump underlaying metal film 12b and then a solder plating film 12e is formed as shown in the illustration of Step S84 in FIG. 11.

Thereafter, a resist film removal of Step S85 is carried out. That is, the portions of the plating resist film 12d around the solder plating films 12e are removed.

Thereafter, a flux application of Step S86 in FIG. 12 (Step S65 in FIG. 10) is carried out. At this step, flux 9 is applied to the multiple solder plating films 12e over the wafer 12 by a spin coat method.

Thereafter, a flux cleaning of Step S87 (reflow/cleaning of Step S66 in FIG. 10) is carried out. At this step, the solder plating films 12e over the wafer 12 are heated and melted at a predetermined temperature by reflowing and cleaned to form multiple solder bumps 5b.

Thereafter, an underlaying film etching of Step S88 is carried out. At this step, the exposed bump underlaying metal films 12b other than those located under the solder bumps 5b are etched using the solder bumps 5b as a mask and removed by UBM etching of Step S67 in FIG. 10.

Wafer back surface polishing is carried out as required to control the thickness of the wafer 12 to a desired value.

Thereafter, a chip dicing of Step S68 in FIG. 10 (chip segmentation of Step S89 in FIG. 12) is carried out. At this step, the wafer is diced into a chip size to form semiconductor chips 4 each having multiple solder bumps 5b placed therein.

Description will be given to the formation of bumps for flip chip bonding on the substrate side. A preparation of land-formed substrate of Step S71 in FIG. 10 is carried out. At this step, the following matrix arrayed substrate 11 having a plurality of device forming areas is prepared by a substrate preparation of Step S91 in FIG. 13: a matrix arrayed substrate 11 having a plurality of device forming areas as a multilayer wiring board including multiple electrodes 2c for flip chip bonding as copper lands and a solder resist film 11a for protecting the surface thereof. The copper lands may be coated with a Ni/Au plating, a Ni/Pd/Au plating, a Sn plating, or the like.

Thereafter, a flux paste application of Step S72 in FIG. 10 is carried out. At this step, paste-like flux 9 (flux paste) is applied to the multiple electrodes 2c for flip chip bonding by a print process using a printing mask 14 as a metal mask by a flux printing of Step S92 in FIG. 13. The paste-like flux 9 is 100% flux.

Thereafter, a micro ball placement of Step S73 in FIG. 10 is carried out. At this step, first, the printing mask 14 is removed and then a ball placement mask 16 is placed in position over the matrix arrayed substrate 11 having a plurality of device forming areas by a solder ball placement of Step S93 in FIG. 14. In the ball placement mask 16, openings are formed in correspondence with the positions of the electrodes 2c for flip chip bonding as bump placement portions. After the placement of the ball placement mask, small solder balls 17 as micro balls are shaken into the openings in the ball placement mask 16. This establishes a state in which a small solder ball 17 is placed over the paste-like flux 9 (flux paste) over each of the electrodes 2c for flip chip bonding.

Thereafter, reflow/cleaning of Step S74 in FIG. 10 and Step S94 in FIG. 14 is carried out. At this step, the small solder balls 17 placed over the paste-like flux 9 over the electrodes 2c for flip chip bonding of the matrix arrayed substrate 11 having a plurality of device forming areas are heated and melted at a predetermined temperature by reflowing and cleaned (flux cleaning) to form multiple solder bumps 5a.

This makes it possible to thin the surface oxide film sticking to each of the solder bumps 5a and make the surface oxide films uniform.

Thereafter, a substrate segmentation of Step S95 in FIG. 14 is carried out to form wiring boards 2 each having multiple solder bumps 5a for flip chip bonding placed therein.

Thereafter, a flip chip bonding of Step S75 in FIG. 10 is carried out. At this step, flip chip bonding is carried out using the following semiconductor chip and wiring board: a semiconductor chip 4 with multiple solder bumps 5b placed therein shown in the illustration of Step S89 in FIG. 12 and a wiring board 2 with multiple solder bumps 5a placed therein shown in the illustration of Step S95 in FIG. 14.

At this time, the same (fluxless) flip chip bonding method as illustrated as Step S11 to Step S14 in FIG. 3 is used to flip chip bond the following semiconductor chip and wiring board to each other: the semiconductor chip 4 shown in the illustration of Step S89 in FIG. 12 and the wiring board 2 shown in the illustration of Step S95 in FIG. 14. This completes the assembly.

Also in the first modification and the second modification, as mentioned above, the flux 9 is supplied to the solder bumps 5a on the substrate side before the semiconductor chip 4 and the wiring board 2 are flip chip bonded to each other. Further, reflow/cleaning (flux cleaning) is carried out before flip chip bonding is carried out. This makes it possible to thin the surface oxide film of the solder bumps 5a and carry out flip chip bonding with the surface oxide films uniformly formed.

Thus as in the assembly of the semiconductor device (BGA 1) illustrated in FIG. 2 to FIG. 4, it is possible to suppress the production of local solder protrusions 5c during fluxless flip chip bonding. As a result, it is possible to reduce the production of a solder bridge between adjacent bumps during flip chip bonding. Since the oxide film over the surfaces of the solder bumps is relatively thin and uniform, the oxide film over the surfaces of the solder bumps are easy to break. As a result, it is possible to reduce the amount of solder pressing required for bonding and reduce the occurrence of solder joint failure.

Further, it is possible to enhance the joint reliability in the flip chip bonding.

The other effects obtained by the first modification and the second modification are the same as the other effects obtained by the assembly of the semiconductor device (BGA 1) illustrated in FIG. 2 to FIG. 4; therefore, the repetitive description thereof will be omitted.

With respect to the flip chip bonding method, the measure described below is taken. The above effects are obtained by the flip chip bonding procedure in which: the solder bumps 5b on the chip side and the solder bumps 5a on the substrate side are brought into contact with each other; and then they are further presses into each other to join the bumps together. Therefore, the steps up to melting and joining of bumps are carried out in a flip chip bonder. In this local reflow flip chip bonding, bumps are pressed into each other by expansion of a bonding tool, a substrate, and the like and the same effects can be obtained even in cases where the procedures described below are taken. In a procedure, alignment in, for example, the flow illustrated in FIG. 3 and a chip bump heat melting & alignment is carried out without melting bumps and thereafter the bonding tool is moved down; and after contact is detected, the bonding tool is heated to carry out bonding. In another procedure, the flux 9 is transferred to the solder bumps 5b on the chip side during flip chip bonding; the solder bumps 5b on the chip side and the solder bumps 5a on the substrate side are aligned with each other; then the bonding tool is moved down; and after contact is detected, the bonding tool is heated to carry out bonding.

Description will be given to a third modification to the first embodiment.

Figure 15:
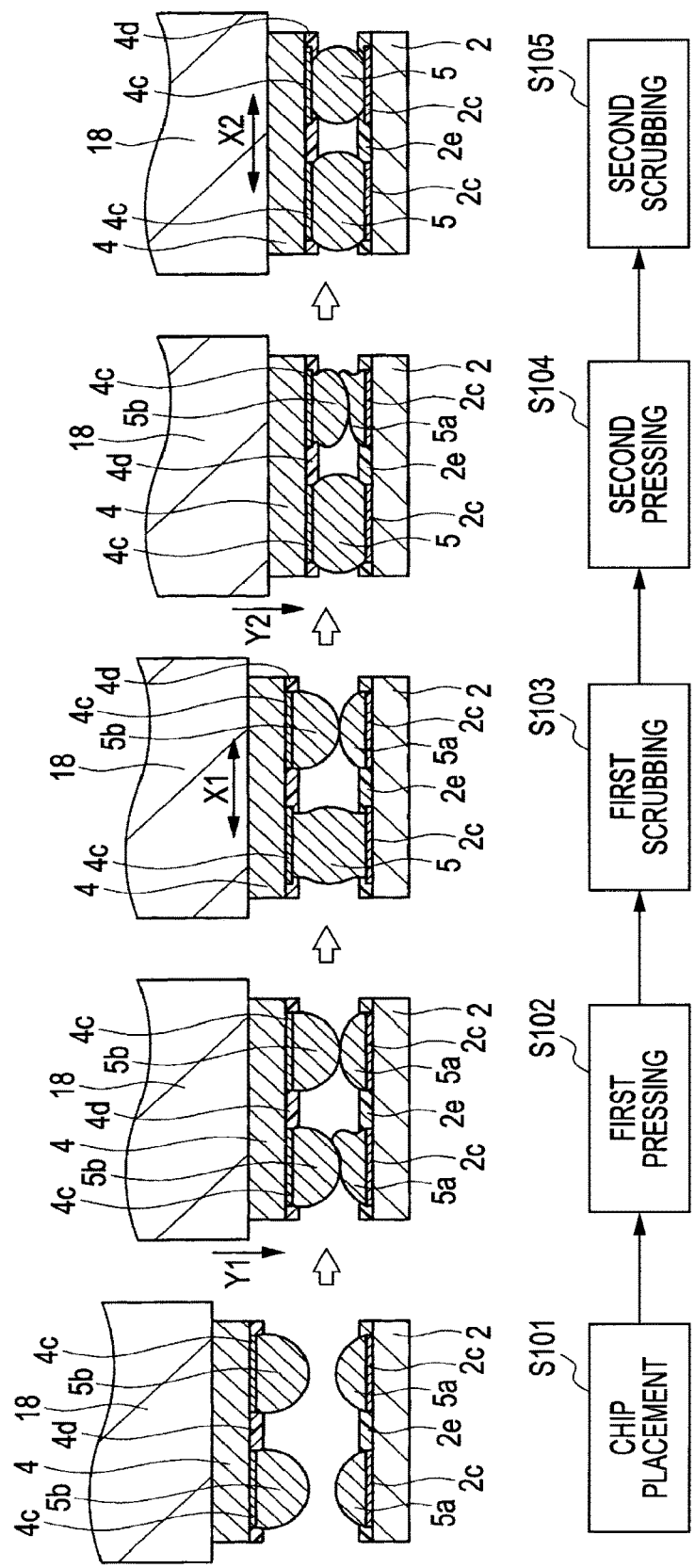
FIG. 15 is a manufacturing flowchart illustrating a third modification to the assembly of a semiconductor device in the first embodiment of the invention.

FIG. 15 is a manufacturing flowchart illustrating the third modification to the assembly of the semiconductor device in the first embodiment of the invention.

In the third modification, the solder bumps 5b on the chip side are pressed into the solder bumps 5a on the substrate side by two-stage action during flip chip bonding.

More specific description will be given. The semiconductor chip 4 supported by the bonding head 18 is placed so that the following is implemented by a chip placement of Step S101 illustrated in FIG. 15: the solder bumps 5a on the substrate side and the solder bumps 5b on the chip side are opposed to each other over the wiring board 2. Thereafter, the solder bumps 5b on the chip side are brought into contact with the solder bumps 5a on the substrate side. After this contact, the semiconductor chip 4 is pressed into the wiring board 2 by the pressing amount Y1 as shown by a first pressing in Step S102. Further, first scrubbing operation (periodical rhythmical vibration) is carried out with the amplitude X1 as shown by a first scrubbing of Step S103.

Thereafter, the semiconductor chip 4 is pressed with the pressing amount Y2 by a second pressing of Step S104 and second scrubbing operation is carried out with the amplitude X2 as shown in the illustration of a second pressing of Step S105.

That is, the solder bumps 5b on the chip side are pressed into the solder bumps 5a on the substrate side by two-stage action. At this time, it is desirable to make the pressing amount Y1 in first pressing smaller than the pressing amount Y2 in second pressing. That is, Y1<Y2.

The reason for this is as follows. There are solder bumps 5a, 5b higher in profile and those lower in profile. To cope with this, the higher solder bumps 5a, 5b are pressed first with a smaller pressing amount and scrubbed to bond them together; thereafter, the lower solder bumps 5a, 5b are pressed and scrubbed to bond them together.

This makes it possible to suppress the length of such local solder protrusions 5c as illustrated in FIG. 32. More specific description will be given. In a first pressing illustrated in FIG. 15, a solder protrusion may be locally produced in a place where the surface oxide film of molten solder bumps is prone to be broken during bonding. Even in this case, the solder protrusion amount (length) can be suppressed because the pressing amount Y1 in the first pressing is smaller than the pressing amount Y2 in the second pressing (Y1<Y2).

In general, a bridge between adjacent bumps is prone to be produced when the bumps are large in volume (high bumps) and the protrusion amount is large. To cope with this, these bumps are scrubbed in the position of the first pressing with the amplitude X1 so that the local broken areas in the surface oxide film are spread all around the bumps. Also in the second pressing thereafter carried out, such solder protrusion directions 5d as shown in FIG. 32 are made to extend (concentrically) all around the bumps. This makes it possible to suppress the production of local solder protrusions and prevent the production of a solder bridge between adjacent bumps.

In the description of the above pressing of the semiconductor chip 4, two-stepped pressing action (action in which pressing and scrubbing are divided from each other) has been taken as an example. The same effect can be obtained even by simultaneously carrying out pressing and scrubbing in place of stepped action.

Description will be given to a fourth modification to the first embodiment.

Figure 16:
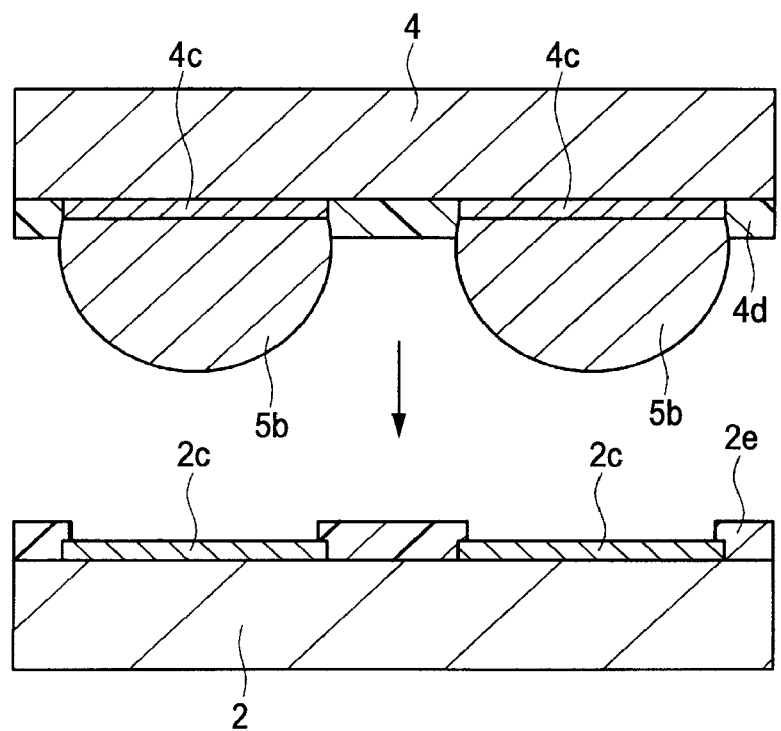
FIG. 16 is a partial sectional view illustrating a fourth modification to the assembly of a semiconductor device in the first embodiment of the invention.

FIG. 16 is a partial sectional view illustrating the fourth modification to the assembly of the semiconductor device in the first embodiment of the invention.

In the fourth modification illustrated in FIG. 16, solder bumps 5b are formed only on the chip side in bump bonding. That is, the drawing illustrates solder bump bonding carried out when solder bumps 5b are provided only in the semiconductor chip 4 and bumps are not provided on the substrate side. Even in this bump bonding, the same effect as in the assembly of the semiconductor device (BGA 1) illustrated in FIG. 2 to FIG. 4 and the first modification to the third modification is obtained as long as the following measure is taken in flip chip bonding: after molten solder bumps are brought into contact, they are pressed to break the surface oxide film of the solder bumps 5b. The production of local solder protrusions can be prevented even in the following cases: cases where the wiring board is a chip as in a chip-on-chip structure; cases where a configuration in which bumps are not used on the wiring board side is adopted; and cases where solder bumps are formed only either on the chip side or on the substrate side. As a result, it is possible to reduce the production of a solder bridge between adjacent bumps during flip chip bonding and obtain the same effect as mentioned above.

Second Embodiment

Figure 17:
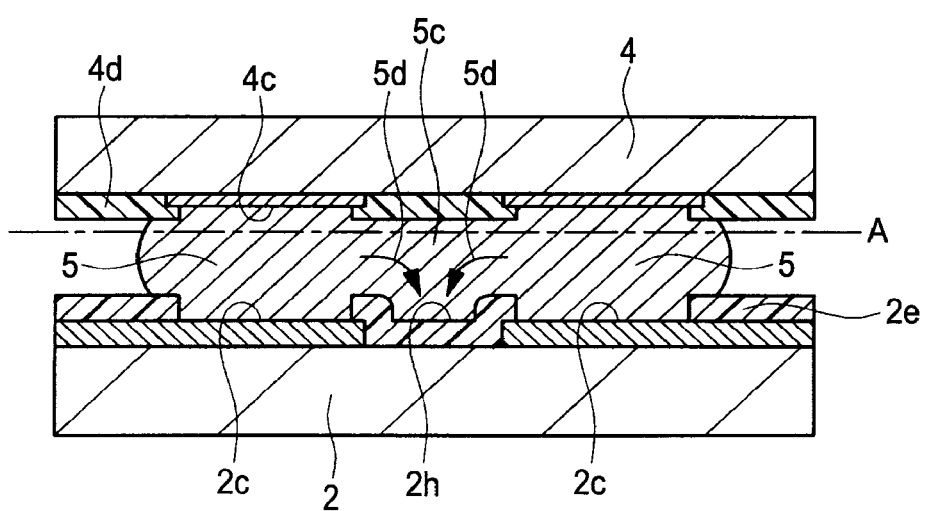
FIG. 17 is an enlarged partial sectional view illustrating the structure of a flip chip bonded portion in a semiconductor device in a comparative example related to a second embodiment of the invention.
Figure 18:
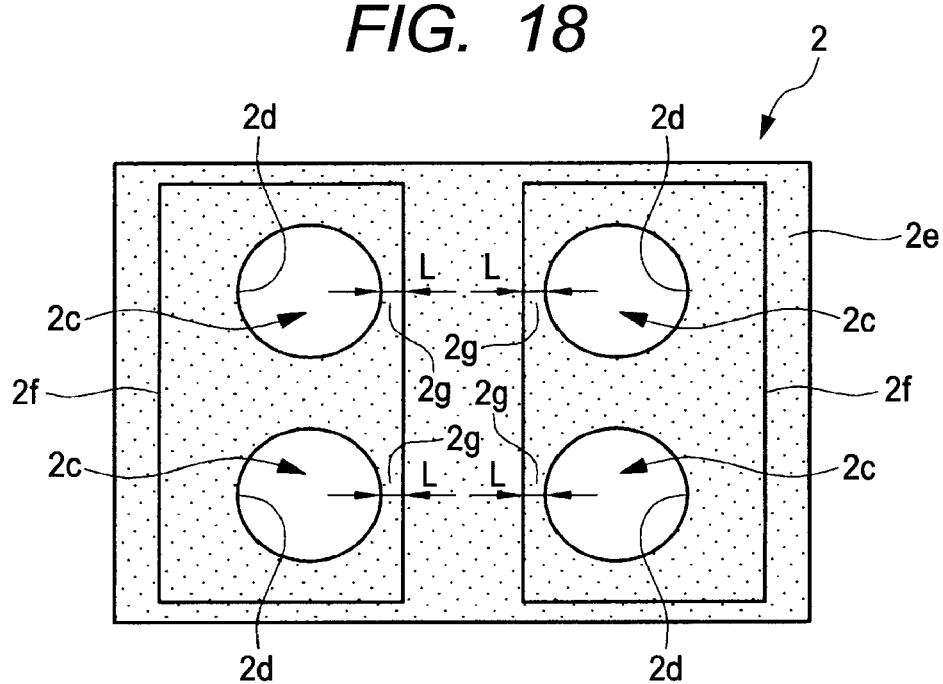
FIG. 18 is a plan view illustrating the positions of openings in a solder resist film relative to terminals of a wiring board with the structure illustrated in FIG. 17.
Figure 19:
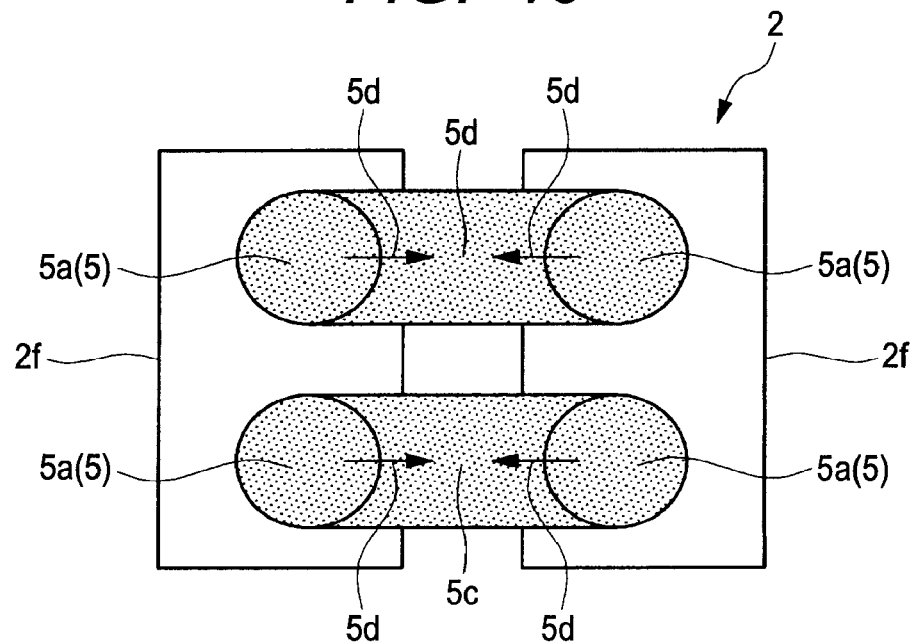
FIG. 19 is a plan view illustrating the solder bridge structure taken along line A of FIG. 17 as viewed from above.
Figure 20:
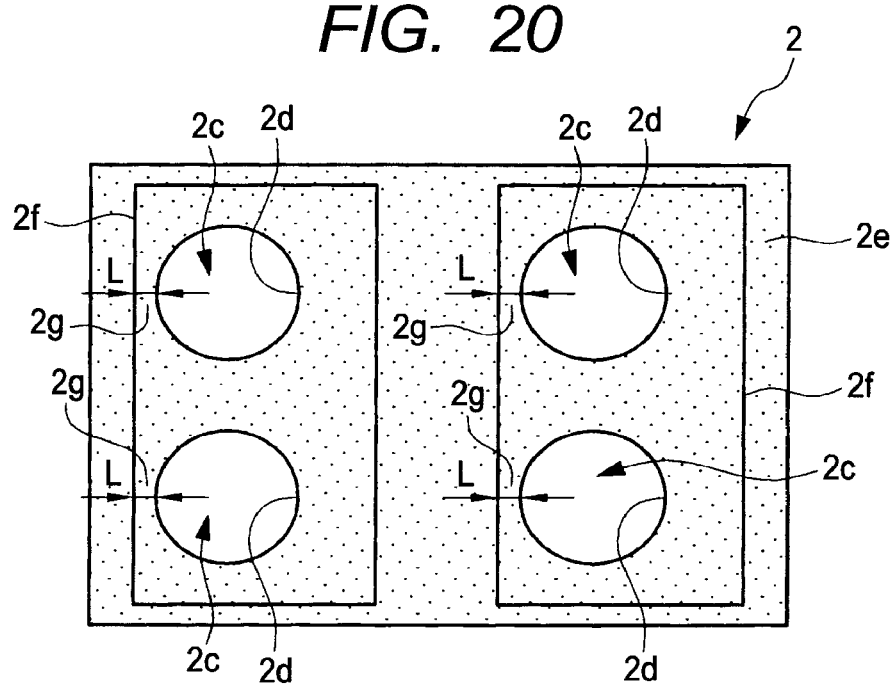
FIG. 20 is a plan view illustrating the positions of openings in a solder resist film relative to terminals of the wiring board in a semiconductor device in the second embodiment of the invention.
Figure 21:
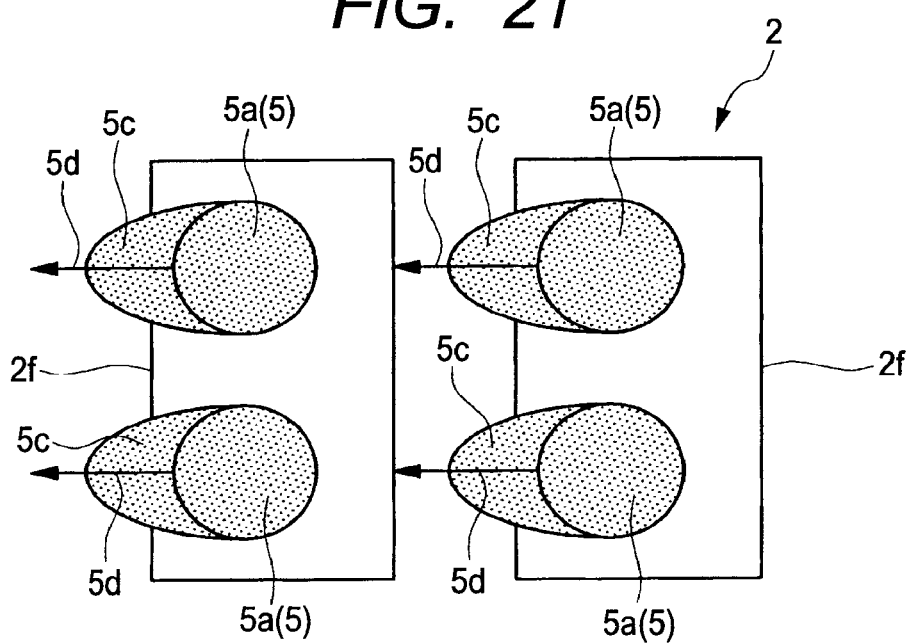
FIG. 21 is a plan view illustrating the direction of solder protrusions formed when solder bumps are placed over openings in the solder resist film illustrated in FIG. 20.
Figure 22:
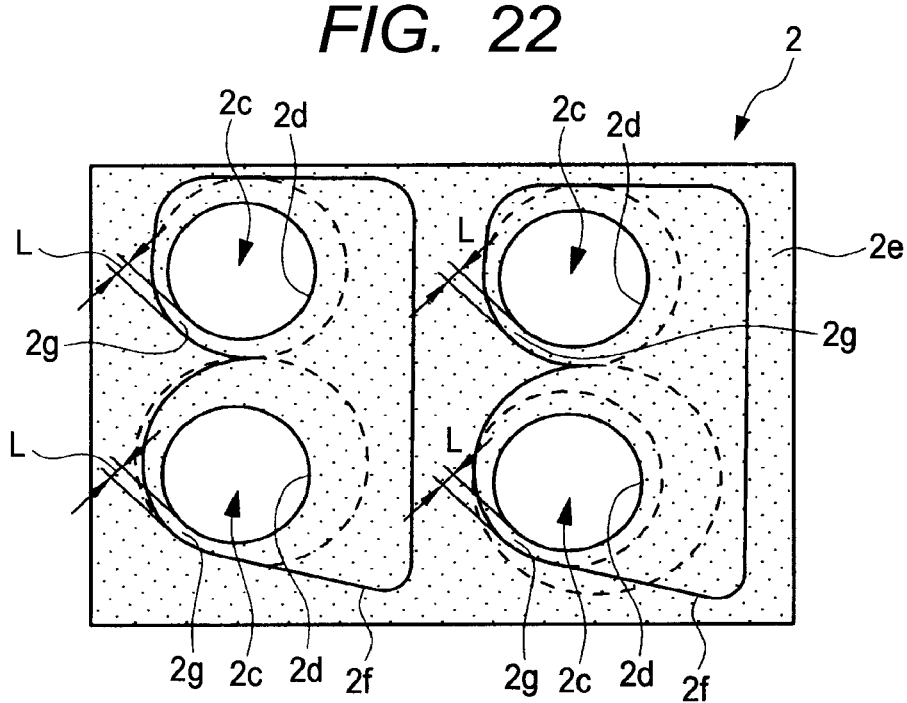
FIG. 22 is a plan view illustrating the positions of openings in a solder resist film relative to terminals of the wiring board in a semiconductor device in a first modification to the second embodiment of the invention.
Figure 23:
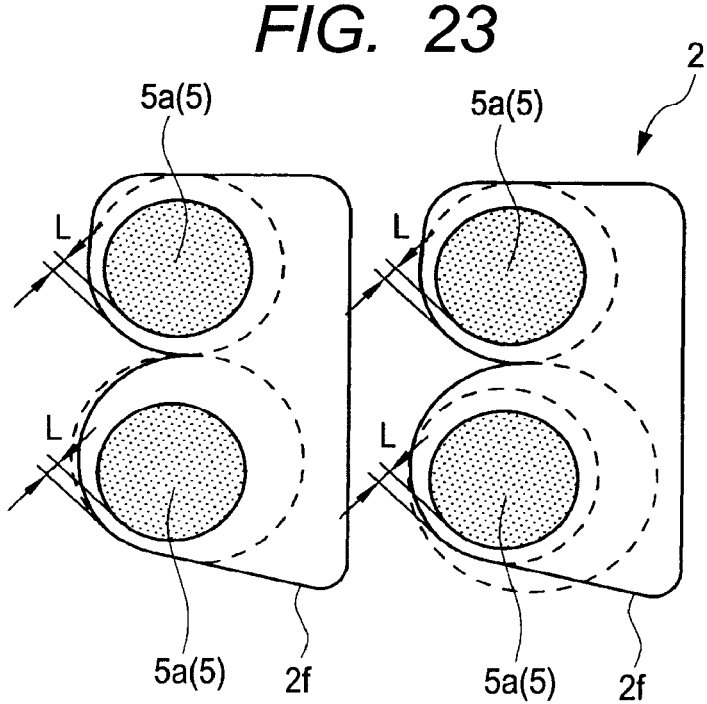
FIG. 23 is a plan view illustrating the structure of solder bumps placed over openings in the solder resist film illustrated in FIG. 22.
Figure 24:
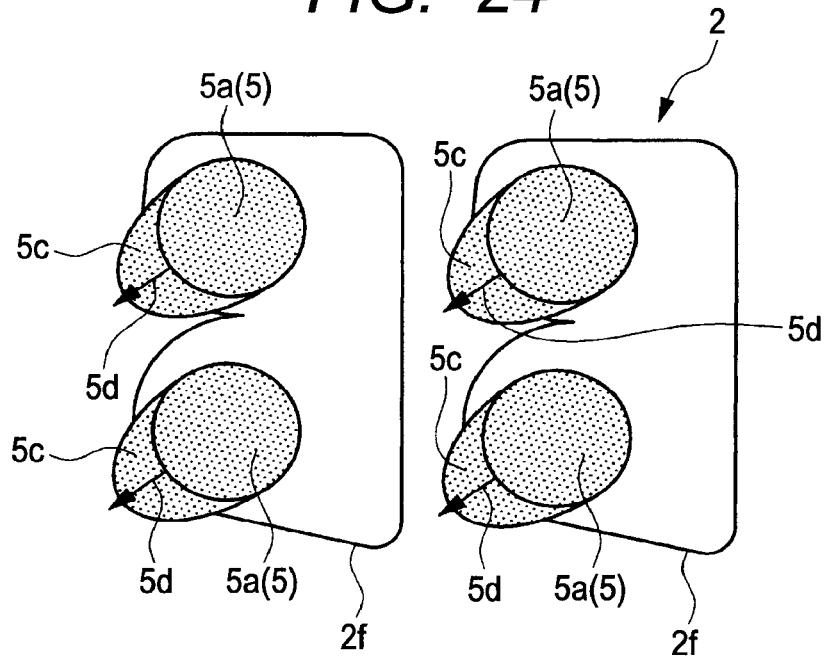
FIG. 24 is a plan view illustrating the direction of solder protrusions formed when solder bumps are placed over openings in the solder resist film illustrated in FIG. 22.
Figure 25:
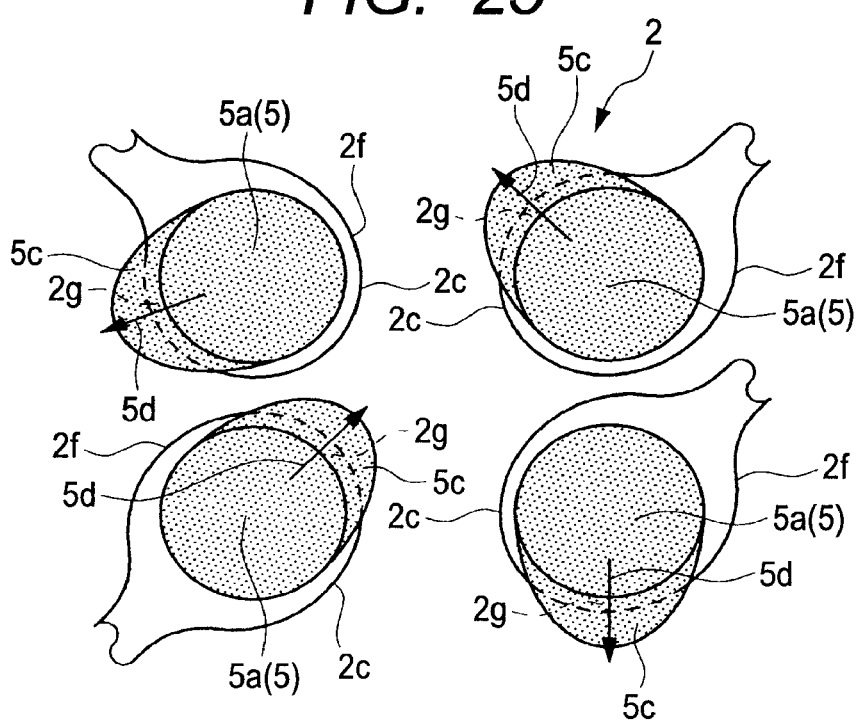
FIG. 25 is a plan view illustrating the direction of solder protrusions formed when solder bumps are placed over openings in a solder resist film of the wiring board in a semiconductor device in a second modification to the second embodiment of the invention.
Figure 26:
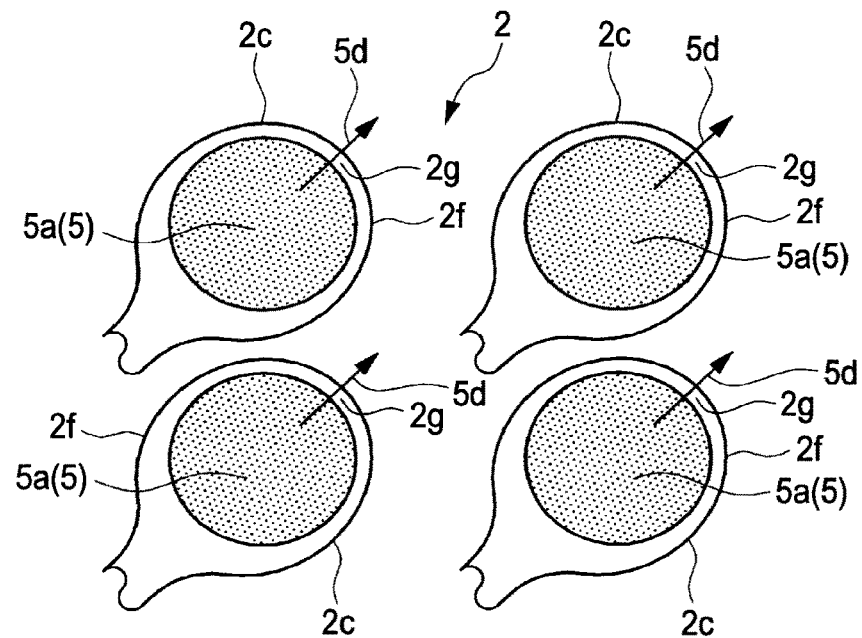
FIG. 26 is a plan view illustrating the direction of solder protrusions formed when solder bumps are placed over openings in a solder resist film of the wiring board in a semiconductor device in a third modification to the second embodiment of the invention.
Figure 27:
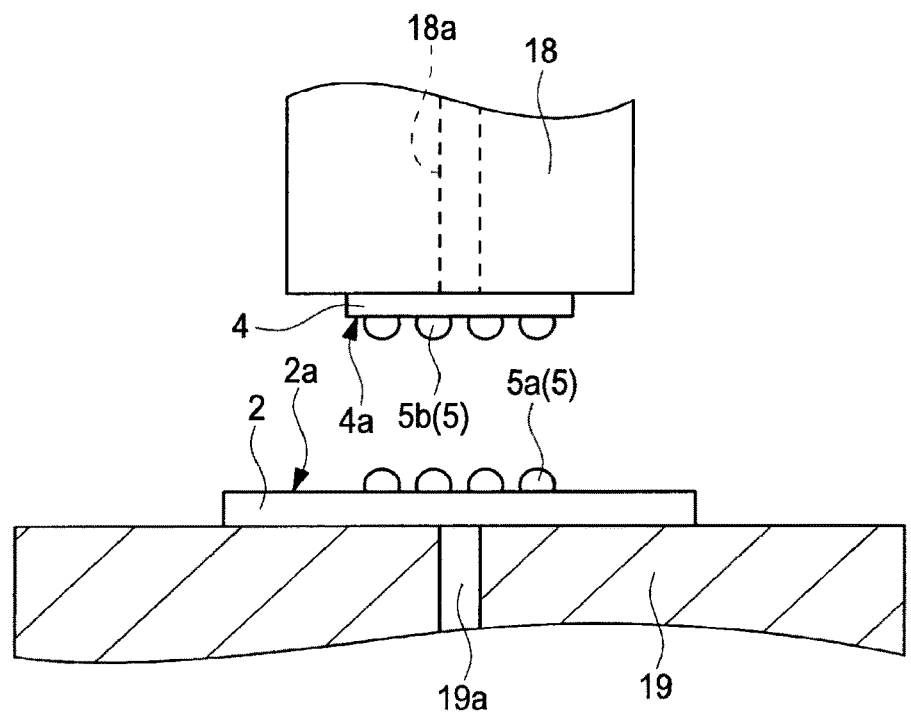
FIG. 27 is a partial sectional view illustrating a procedure for fluxless flip chip bonding in a comparative example.
Figure 28:
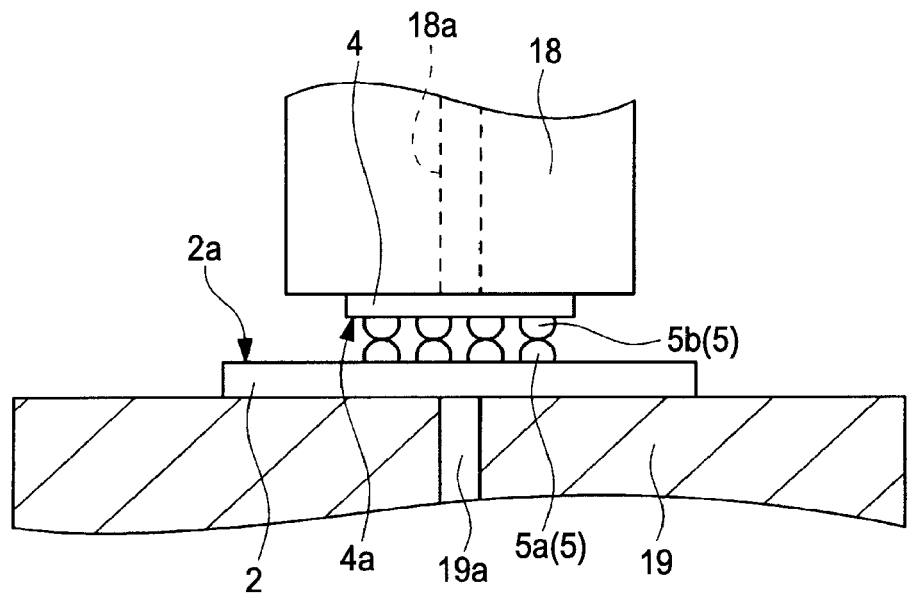
FIG. 28 is a partial sectional view illustrating the procedure for fluxless flip chip bonding in the comparative example.
Figure 29:
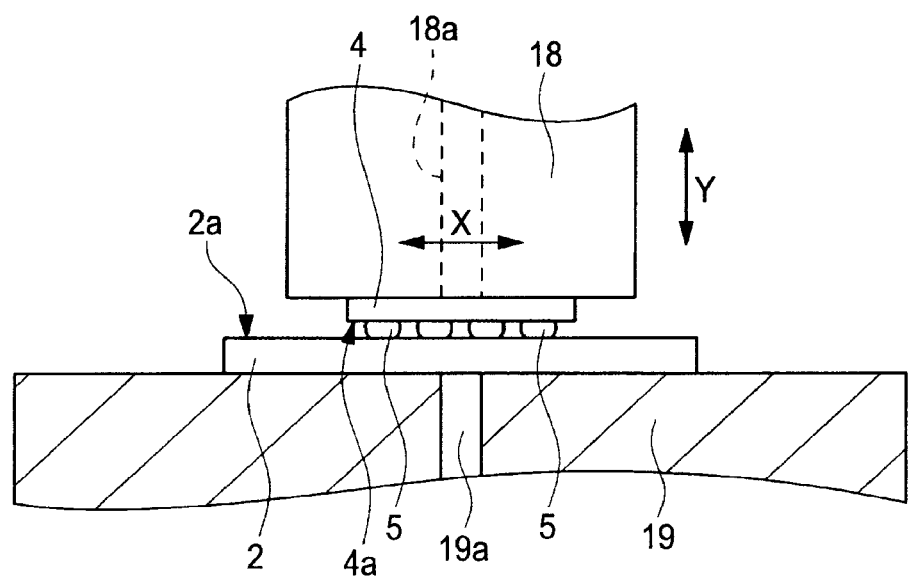
FIG. 29 is a partial sectional view illustrating the procedure for fluxless flip chip bonding in the comparative example.
Figure 30:
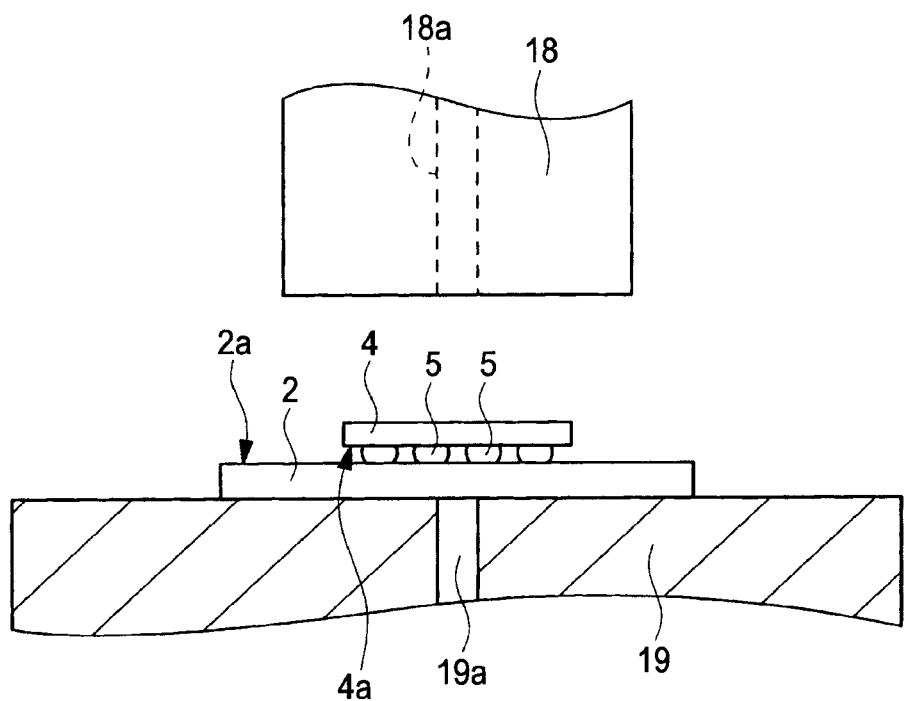
FIG. 30 is a partial sectional view illustrating the procedure for fluxless flip chip bonding in the comparative example.
Figure 31:
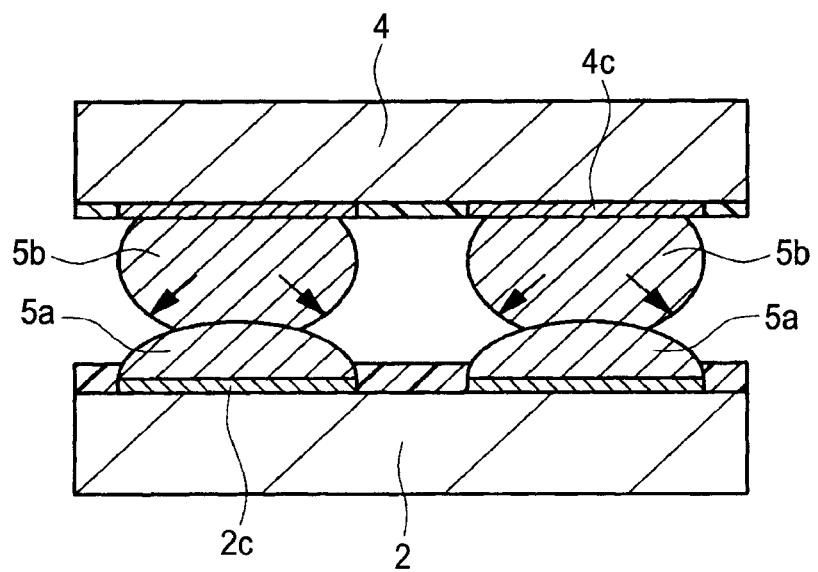
FIG. 31 is an enlarged partial sectional view illustrating the procedure for fluxless flip chip bonding in the comparative example.

FIG. 17 is an enlarged partial sectional view illustrating the structure of a flip chip bonded portion in a semiconductor device in a comparative example related to the second embodiment of the invention; FIG. 18 is a plan view illustrating the positions of openings in the solder resist film relative to terminals of the wiring board with the structure illustrated in FIG. 17; and FIG. 19 is a plan view illustrating the solder bridge structure cut along line A of FIG. 17 as viewed from above. FIG. 20 is a plan view illustrating the positions of openings in the solder resist film relative to terminals of the wiring board in a semiconductor device in the second embodiment of the invention; FIG. 21 is a plan view illustrating the direction of solder protrusions obtained when solder bumps are placed over the openings in the solder resist film illustrated in FIG. 20; and FIG. 22 is a plan view illustrating the positions of openings in the solder resist film relative to terminals of the wiring board in a semiconductor device in a first modification to the second embodiment of the invention. FIG. 23 is a plan view illustrating the structure of solder bumps placed over the openings in the solder resist film illustrated in FIG. 22; FIG. 24 is a plan view illustrating the direction of solder protrusions obtained when solder bumps are placed over the openings in the solder resist film illustrated in FIG. 22; FIG. 25 is a plan view illustrating the directions of solder protrusions obtained when solder bumps are placed over openings in the solder resist film of the wiring board in a semiconductor device in a second modification to the second embodiment of the invention; and FIG. 26 is a plan view illustrating the direction of solder protrusions obtained when solder bumps are placed over openings in the solder resist film of the wiring board in a semiconductor device in a third modification to the second embodiment of the invention.

The second embodiment is so configured that the production of local solder protrusions is suppressed during flip chip bonding in a semiconductor device (for example, the BGA 1 illustrated in FIG. 1) assembled by carrying out flip chip bonding. The production of local solder protrusions is suppressed by the structure of a wiring board 2 flip chip bonded with a semiconductor chip.

In the description of the second embodiment, the following case will be taken as an example with respect to the solder bridges (bridges between bumps) illustrated in the comparative example in FIG. 17 and FIG. 19: cases where the pits and projections (opening pattern) in the insulating film over the substrate surface are so shaped, as viewed in a plane, that the following is implemented: a bridge between adjacent bumps is less prone to be produced because of the relation with the outer shape pattern (land metal shape) of each electrode 2c for flip chip bonding.

In solder bumps, the following takes place when the oxide film over the surfaces of bumps are thin and uniform: such solder protrusions 5c as illustrated in FIG. 19 tend to enlarge as the distance between the substrate surface and the chip surface is narrowed.

FIG. 17 and FIG. 19 illustrating solder bumps 5 show a case where multiple bumps are formed over each of common large metal lands (electrodes 2c for flip chip bonding) like a power supply and ground. The drawings show the boundary between metal lands (electrodes 2c for flip chip bonding) different in kind, for example, ground and a power supply.

When there is a recessed portion 2h in the solder resist film 2e as an insulating film over the substrate surface, the following may take place depending on, for example, the shape of each metal land (electrode 2c for flip chip bonding) of the wiring board 2: as illustrated in FIG. 17, the solder protrusion directions 5d tend to extend to the direction thereof (toward the recessed portion 2h): Therefore, such a land shape that a solder protrusion 5c is extended to the direction of the shortest pitch (the nearest area) reduces the pressing amount at which a bridge between adjacent bumps and narrows the settable range of pressing amount to reduce the junction margin. As a result, a solder bridge results.

That is, a solder bridge is prone to be caused when the following shortest parts 2g are placed in positions where they are opposed to each other between adjacent solder bumps 5 between the bumps in flip chip bonding as illustrated in FIG. 18: the shortest parts 2g where the distance between the following patterns is shortest: the outer shape pattern 2f of an electrode 2c for flip chip bonding as a metal land as viewed in a plane; and the opening pattern (bump placement portion pattern) 2d for the electrode 2c for flip chip bonding in the solder resist film 2e as viewed in a plane.

In the second embodiment, consequently, the following shortest parts 2g are placed in positions where they are not opposed to each other between adjacent bumps between the bumps in flip chip bonding: the shortest parts 2g where the distance between the following patterns is shortest: the outer shape pattern 2f of an electrode 2c for flip chip bonding in the wiring board 2 as viewed in a plane; and the opening pattern (bump placement portion pattern) 2d for the electrode 2c for flip chip bonding in the solder resist film 2e as viewed in a plane.

Some examples will be taken. With respect to the following patterns in FIG. 20, the shortest part 2g refers to a part where the distance L between the outer shape pattern 2f and the opening pattern 2d is shortest: the outer shape pattern 2f of an electrode 2c for flip chip bonding as viewed in a place and the opening pattern 2d for the electrode 2c for flip chip bonding in the solder resist film 2e as viewed in a plane. As illustrated in FIG. 21, the shortest parts are placed in positions where the directions 5d of their respective solder protrusions from adjacent solder bumps 5 are not identical.

That is, the shortest parts 2g are arranged so that the solder protrusion directions 5d are not opposed to each other by shifting the following positions from each other: the position of each midpoint between shortest-pitch (nearest) bumps (opening patterns 2d) and the position of each midpoint between lands (outer shape patterns 2f).

In the first modification to the second embodiment illustrated in FIG. 22 to FIG. 24, the individual shortest parts 2g are so placed that their identical solder protrusion directions 5d agree with the diagonal directions (oblique direction) of solder bumps 5. In this case, a space between bumps can be additionally provided and this structure is preferable.

FIG. 25 and FIG. 26 illustrate examples of isolated lands like signal bumps. In the second modification to the second embodiment illustrated in FIG. 25, the shortest parts 2g in electrodes 2c for flip chip bonding as isolated lands are arranged in such positions that their respective solder protrusion directions 5d differ from one another between the bumps.

In the third modification to the second embodiment illustrated in FIG. 26, the shortest parts 2g in electrodes 2c for flip chip bonding as isolated lands are arranged in positions where their respective solder protrusion directions 5d are identical between the bumps. The structure in FIG. 26 makes it possible to provide solder with a tendency to protrude in the longest-pitch direction.

According to the semiconductor device in the second embodiment including the first modification to the third modification, as mentioned above, the following shortest parts 2g are placed in positions where they are not opposed to each other between bumps: the shortest parts where the distance between the following patterns is shortest: the outer shape pattern 2f of an electrode 2c for flip chip bonding in the wiring board 2 as viewed in a place and the opening pattern 2d for the electrode 2c for flip chip bonding in the solder resist film 2e as viewed in a plane. This makes it possible to reduce the production of a solder bridge between adjacent bumps during flip chip bonding.

As a result, it is possible to enhance the joint reliability in flip chip bonding of a semiconductor device.

Up to this point, concrete description has been given to the invention made by the present inventors based on embodiments of the invention. However, the invention is not limited to the above embodiments and can be variously modified without departing from the subject matter thereof, needless to add.

Some examples will be taken. In the description of the second embodiment, a means for reducing the production of a solder bridge by lands (electrodes 2c for flip chip bonding) on the substrate side has been taken as an example. Instead, the means in the second embodiment can also be applied to lands (electrode pads 4c) on the chip side.

The technology in which flux 9 is applied to solder bumps 5a on the substrate side and then the reflow/cleaning (flux cleaning) is carried out before flip chip bonding is carried out has been described in relation to the first embodiment. This technology may be applied to solder bumps 5b on the chip side and even in this case, the same effects as in cases where it is applied to solder bumps 5a on the substrate side can be obtained.

The following technologies may be combined or may be singly adopted: the technology for the assembly of a semiconductor device described in relation to the first embodiment and illustrated in FIG. 2 to FIG. 4; the technologies in the first modification to the fourth modification thereto; the technology related to the structure of a semiconductor device described in relation to the second embodiment; and the technologies in the first modification to the third modification to the second embodiment.

The invention is favorably applicable to the assembly of an electronic device using flip chip bonding.

What is claimed is:

1. A method of manufacturing a semiconductor device, comprising the steps, of:
   (a) providing a wiring board having an upper surface, a plurality of electrodes formed on the upper surface, solder materials respectively formed over the electrodes of the wiring board, and a lower surface opposite to the upper surface;
   (b) after the step (a), applying a first solder paste to the upper surface of the wiring board;
   (c) after the step (b), mounting an electronic component over the upper surface of the wiring board via the first solder paste;
   (d) after the step (c), carrying out reflow/cleaning on the first solder paste;
   (e) after the step (d), applying flux to the solder materials;
   (f) after the step (e), carrying out reflow/cleaning on the solder materials; and
   (g) after the step (f), positioning a semiconductor chip over the upper surface of the wiring board such that a main surface of the semiconductor chip faces the upper surface of the wiring board, and electrically connecting a plurality of bumps comprised of solder material and formed over the main surface of respectively, by melting the bumps of the semiconductor chip, contacting the bumps of the semiconductor chip to the solder materials of the wiring board, respectively, melting the solder materials of the wiring board, and subsequently scrubbing the bumps of the semiconductor chip and the solder materials of the wiring board with each other so as to break an oxidized film formed on the bumps of the semiconductor chip and on the solder materials of the wiring board to allow direct contact between the bumps and solder materials.

2. The method according to claim 1, wherein the solder materials are formed by following steps (a1)-(a2),
   (a1) applying a second solder paste to the electrodes of the wiring board; and
   (a2) after the step (a1), carrying out reflow/cleaning on the second solder paste.

3. The method according to claim 1, wherein the step (g) is carried out by steps comprising (g1)-(g6):
   (g1) positioning the semiconductor chip over the upper surface of the wiring board such that the bumps and the solder materials are respectively opposed to each other;
   (g2) after the step (g1), contacting the bumps with the solder materials, respectively;
   (g3) after the step (g2), pressing the semiconductor chip toward the wiring board with a first pressing amount;
   (g4) after the step (g3), scrubbing the bumps and the solder materials with each other;
   (g5) after the step (g4), pressing the semiconductor chip toward the wiring board with a second pressing amount; and
   (g6) after the step (g5), scrubbing the bumps and the solder materials with each other.

4. The method according to claim 3, wherein the first pressing amount is smaller than the second pressing amount.

5. The method according to claim 1,
wherein the oxidized film formed over a surface of each of the solder materials is thinned by the steps (e) and (f).

6. The method according to claim 3, wherein the scrubbing of step (g4) occurs at a first vibrational amplitude, and the scrubbing of step (g6) occurs at a second vibrational amplitude.

* * * * *